(12) United States Patent
Stansfield

(10) Patent No.: US 9,406,351 B2
(45) Date of Patent: Aug. 2, 2016

(54) MEMORY WITH LOCAL-/GLOBAL BIT LINE ARCHITECTURE AND ADDITIONAL CAPACITANCE FOR GLOBAL BIT LINE DISCHARGE IN READING

(71) Applicant: SURECORE LIMITED, Leeds (GB)

(72) Inventor: Anthony Stansfield, Backwell (GB)

(73) Assignee: SURECORE LIMITED, Leeds (GB)

( * ) Notice: Subject to any disclaimer, the term of this patent is extended or adjusted under 35 U.S.C. 154(b) by 0 days.

(21) Appl. No.: 14/783,248

(22) PCT Filed: Apr. 1, 2014

(86) PCT No.: PCT/GB2014/051023
§ 371 (c)(1),
(2) Date: Oct. 8, 2015

(87) PCT Pub. No.: WO2014/167292
PCT Pub. Date: Oct. 16, 2014

(65) Prior Publication Data
US 2016/0064044 A1    Mar. 3, 2016

(30) Foreign Application Priority Data
Apr. 8, 2013    (GB) .................................. 1306327.6

(51) Int. Cl.
*G11C 7/12*    (2006.01)
*G11C 7/06*    (2006.01)
(Continued)

(52) U.S. Cl.
CPC .. *G11C 7/06* (2013.01); *G11C 7/12* (2013.01); *G11C 7/18* (2013.01); *G11C 11/419* (2013.01); *G11C 2207/005* (2013.01)

(58) Field of Classification Search
CPC ....................................................... G11C 7/12

USPC .................................................... 365/189.17
See application file for complete search history.

(56) References Cited

U.S. PATENT DOCUMENTS 5,682,343 A * 10/1997 Tomishima ........ G11C 11/4096
365/189.15
5,777,935 A    7/1998 Pantelakis et al.
(Continued)

FOREIGN PATENT DOCUMENTS

EP    1498903 A2    1/2005

OTHER PUBLICATIONS

Great Britain Intellectual Property Office Combined Search and Examination Report issued in connection with Great Britain Patent Application No. GB1306327.6, dated Sep. 16, 2013.
(Continued)

*Primary Examiner* — Son Mai
(74) *Attorney, Agent, or Firm* — Meunier Carlin & Curfman LLC

(57) ABSTRACT

There is provided a memory unit comprising one or more global bit lines connected to a sense amplifier, and a plurality of memory cells that are grouped into a plurality of memory cell groups, each memory cell group having one or more local bit lines operatively connected to each of the memory cells in the memory cell group. Each memory cell group is configured such that, when a memory cell of the memory cell group is being read, the one or more local bit lines of the memory cell group are provided as inputs to a logic circuit and are not connected to the global bit lines, the logic circuit being configured to cause a capacitance element to be connected to one of the one or more global bit lines in dependence upon the states of the one or more local bit lines of the memory cell group.

19 Claims, 14 Drawing Sheets

(51) Int. Cl.
*G11C 7/18* (2006.01)
*G11C 11/419* (2006.01)

(56) References Cited

U.S. PATENT DOCUMENTS

| | | | |
|---|---|---|---|
| 7,613,052 B2 | 11/2009 | Van Winkelhoff et al. | |
| 8,072,823 B2* | 12/2011 | Aihara | G11C 7/12 365/145 |
| 8,824,197 B2* | 9/2014 | Moriwaki | G11C 11/419 365/154 |
| 8,934,313 B2* | 1/2015 | Song | G11C 5/145 365/189.07 |
| 2004/0037139 A1* | 2/2004 | Shimizu | G11C 7/12 365/203 |
| 2009/0303798 A1 | 12/2009 | Morton et al. | |
| 2010/0097839 A1 | 4/2010 | Kim | |
| 2012/0127782 A1 | 5/2012 | Moriwaki | |
| 2012/0206988 A1 | 8/2012 | Song et al. | |
| 2013/0039120 A1 | 2/2013 | Moriwaki | |
| 2013/0051170 A1 | 2/2013 | Kuroda | |

OTHER PUBLICATIONS

Invitation to Pay Additional Fees and, Where Applicable, Protest Fee and Partial International Search Report issued in connection with International Application No. PCT/GB2014/051023, mailed Sep. 17, 2014.

International Search Report and Written Opinion issued in connection with International Application No. PCT/GB2014/051023, mailed Feb. 13, 2015.

* cited by examiner

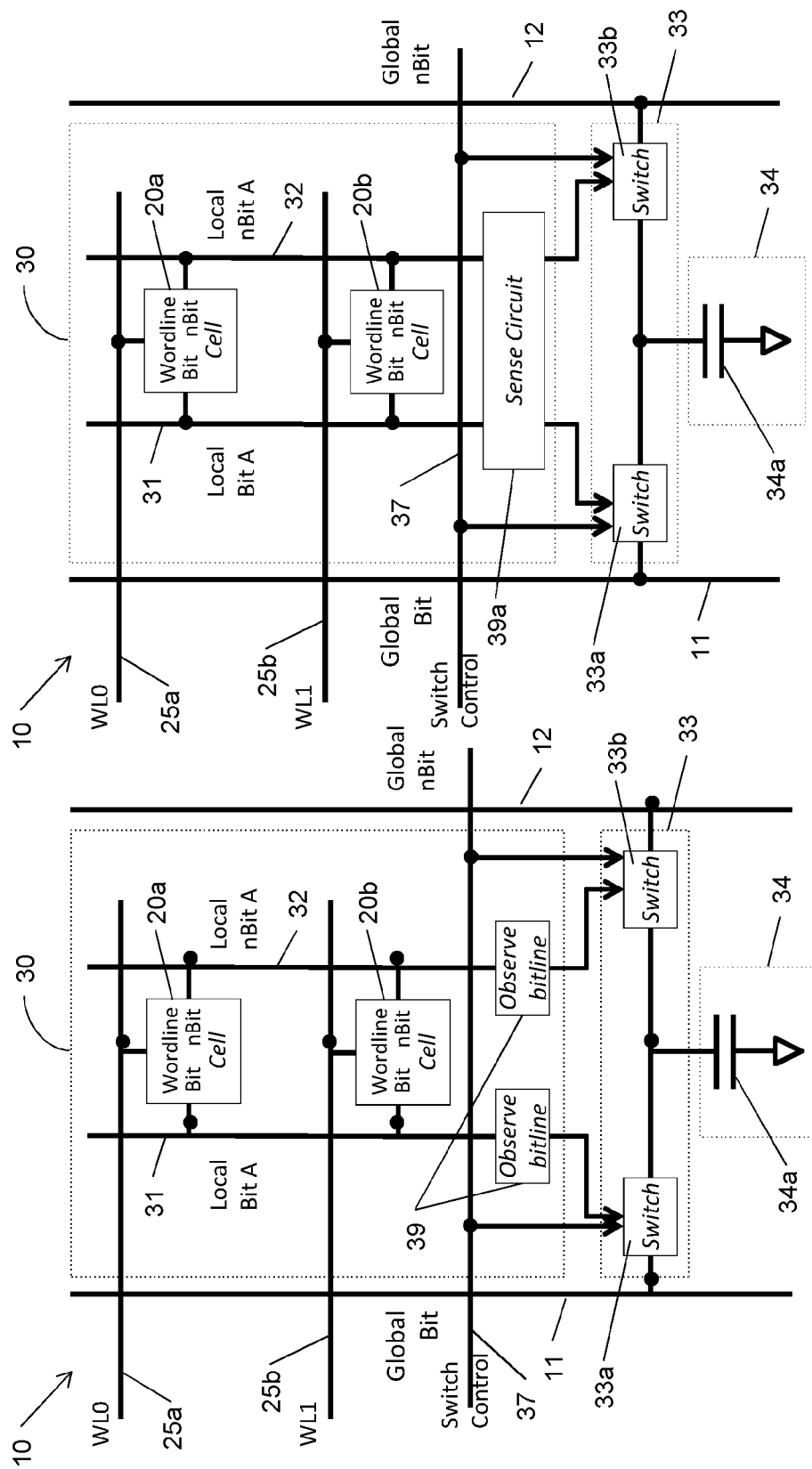

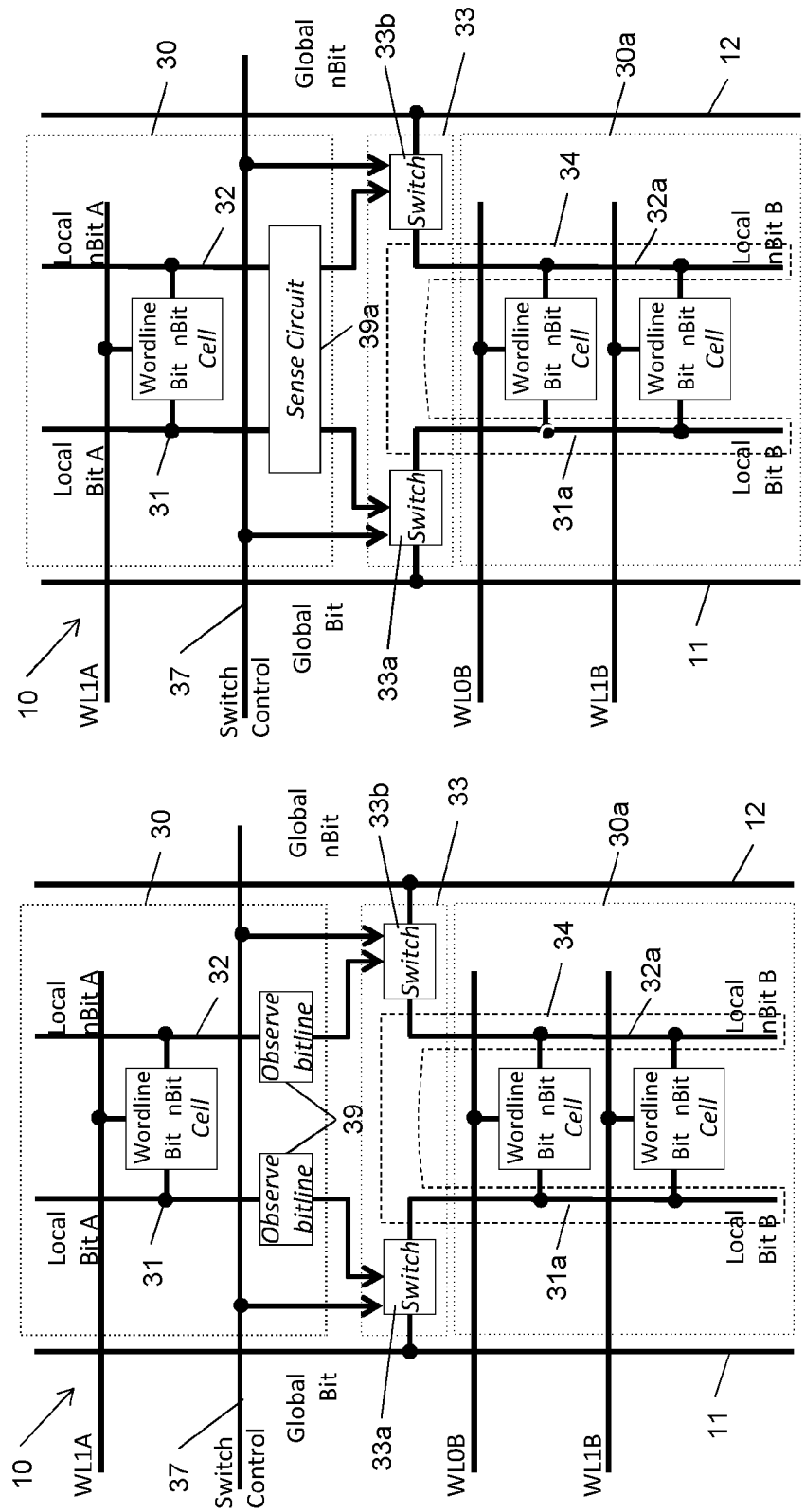
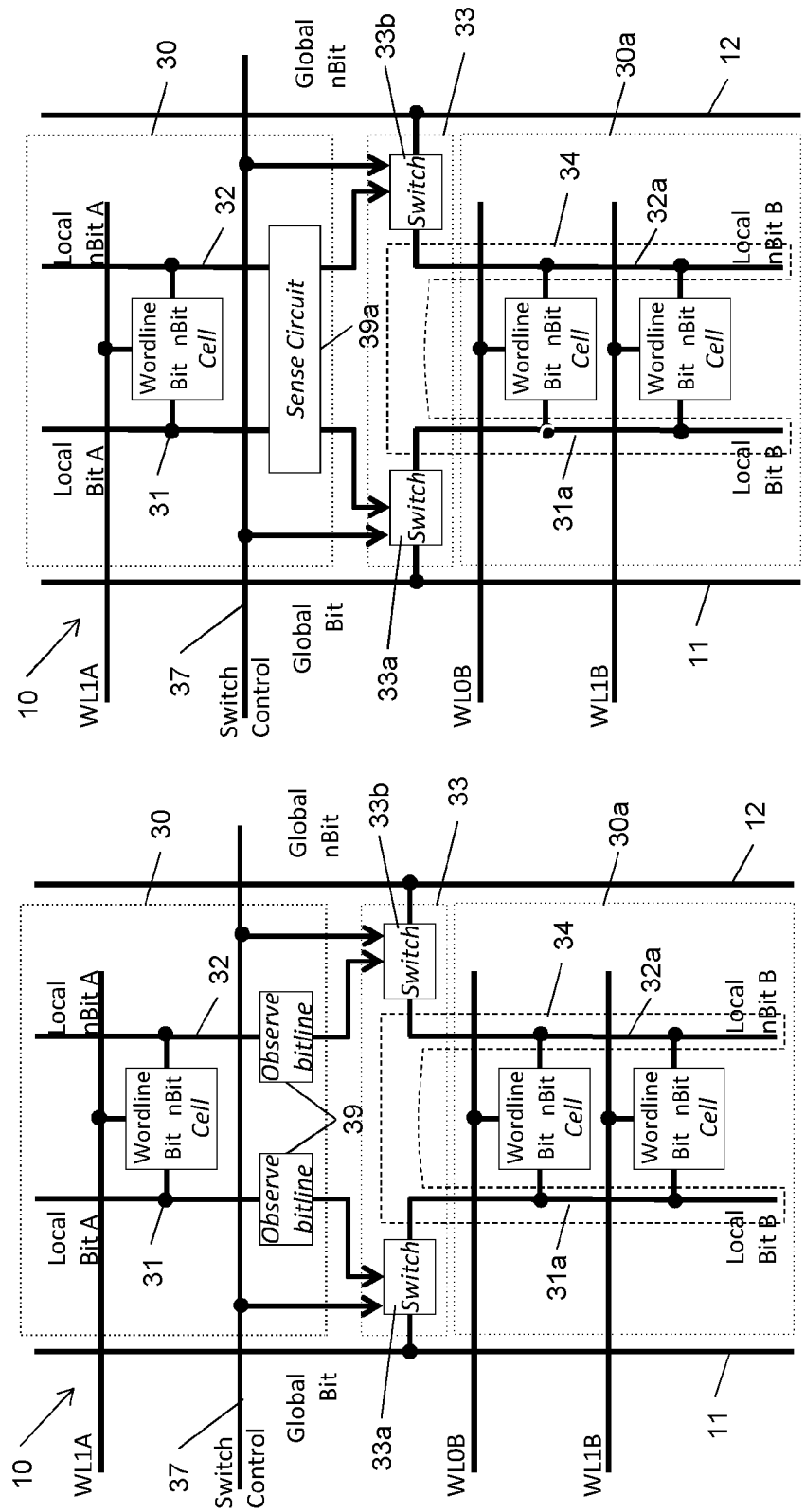
Figure 11b
Figure 11a

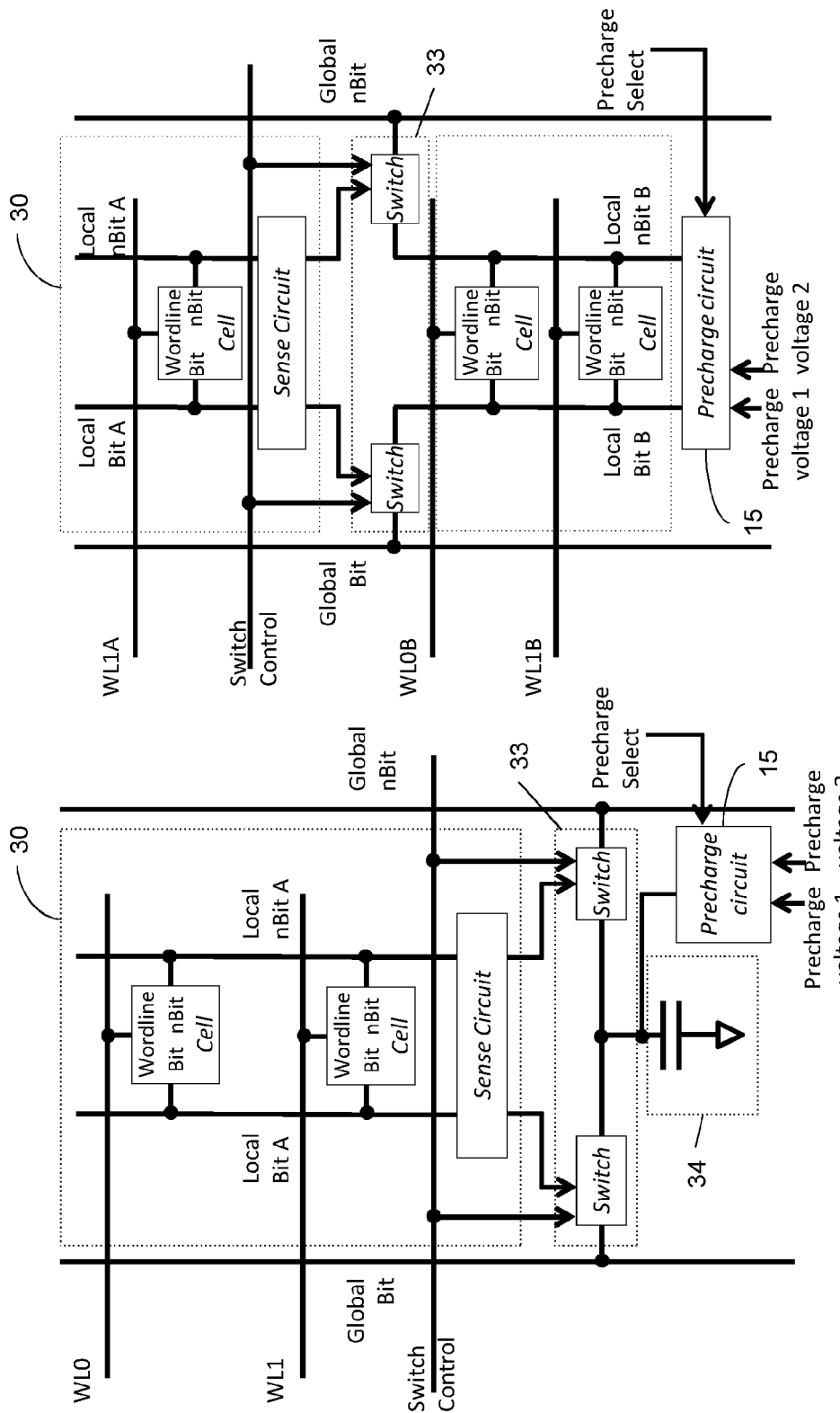

MEMORY WITH LOCAL-/GLOBAL BIT LINE ARCHITECTURE AND ADDITIONAL CAPACITANCE FOR GLOBAL BIT LINE DISCHARGE IN READING

The present invention relates to memory units providing digital data storage. In particular, the present invention provides apparatus and methods that reduce the overall operating power of memory units that have a hierarchical bit line arrangement.

Data storage is an essential requirement for virtually all modern digital electronic systems. Static read/write memory (SRAM) comprises a major part of that function, being relatively easy to integrate into a semiconductor device together with large amounts of logic, thus offering fast access and low power. With the advent of deep sub-micron (DSM) geometry silicon processing, the task of implementing reliable storage whilst simultaneously maintaining low power consumption becomes increasingly problematic, whilst conversely demand rises with the proliferation of battery-powered electronic gadgets requiring progressively larger memories.

A common design of memory cell is the 6-transistor circuit shown in FIG. 1 and consists of a storage element made up of two back-to-back inverters 21, 22 with respective access transistors 26, 27 which are turned ON by means of a word line control 25 to form a conducting path between the data storage nodes 23, 24 of the cell 20 and the external bit lines (Bit and nBit). Writing to the cell is achieved by forcing a high voltage onto one of the bit lines (Bit or nBit) whilst simultaneously forcing a low voltage onto the other, and then driving the word line 25 high to activate the access path allowing the voltage levels held on the bit lines (Bit and nBit) to overcome the state of the storage element. The word line 25 is then driven low to disconnect the memory cell 20 with its data store held in its new state. Reading from the cell is achieved by initially driving both bit lines to a notionally high voltage level before then driving the word line 25 high. One of either Bit or nBit will then be pulled low through the access devices by the low voltage side of the storage cell. The difference in voltage levels between the two bit lines can then be sensed and used to determine the data value.

A block of memory constructed from traditional 6-transistor memory cells is shown in FIG. 2. The block illustrated in FIG. 2 contains an array of cells, with the word lines connected across the rows of the array and bit lines running along the columns. By convention the word lines are always said to run along the rows of an array of memory cells whilst the bit lines are always said to run down the columns of an array of memory cells, irrespective of the orientation of the array. Typically, a multiplex structure will be provided at the bottom of the array for selecting which of the columns is to be accessed (for either read or write) according to a set of column select signals which are derived from the address supplied to the memory by the user. Initially before each memory access, the bit lines for all columns are pre-charged into a high state (circuitry not shown).

For a write operation in which a data value is written to a memory cell, the voltage on one or other of the bit lines (Bit and nBit) (according to the required input data value) is driven low for the column in which the memory cell is located, and then the word line controlling the row in which the memory cell is located is pulsed high for long enough to write the data into that cell.

For a read operation in which a data value stored in a memory cell is read, the bit lines (Bit and nBit) for the column in which the memory cell is located are both pulled high, while the word lines are held low (this is commonly referred to as the bit line pre-charge part of the cycle). The word line controlling the row in which the cell is located is then pulled high. This turns on the memory cell access transistors in the row of memory cells, and so connects all of the memory cells in that row to the associated bit lines. Each memory cell in the row therefore starts to pull one of the bit lines (either Bit or nBit, depending on its stored data) low. Since the access transistors are relatively small, and the bit lines have relatively high capacitance, the bit line voltage falls slowly. Sometime later, once a sufficient voltage difference has developed between Bit and nBit, the voltage difference is measured and converted into a logical high or low, and the word line is pulled low again. The bit lines are then pulled high again, ready for the next access.

For this read operation the access time for the memory cell depends strongly on the time taken for a sufficient voltage difference to be developed on the bit lines. If the cell draws a current $I_{read}$ from the bit line, which has a capacitance C, then the time t to create a voltage difference $\Delta V$ is determined by the equation:

$$C\Delta V = I_{read} t \qquad \text{[Equation 1]}$$

$$t = C\Delta V / I_{read} \qquad \text{[Equation 2]}$$

Therefore small read currents, large capacitances and/or large voltage differences result in slow access times.

The necessary voltage difference for a reliable measurement is determined by the properties of the sense amplifier used to measure it, which is itself a key part of the memory design. Sense amplifiers are often controlled by a clock signal, and the timing is set by using the above equation, and assuming the worst-case values for C, $\Delta V$ and $I_{read}$:

$$t = C\Delta V / I_{read\_min} \qquad \text{[Equation 3]}$$

In addition, the energy dissipated by this read operation includes a contribution for recharging the bit lines after the read, i.e. for replacing the charge that has been removed by the cell being accessed. This charge is given by:

$$Q = I_{read} t \qquad \text{[Equation 4]}$$

wherein t is determined by the equation above, such that:

$$Q = I_{read} C\Delta V / I_{read\_min} \qquad \text{[Equation 5]}$$

$$Q = C\Delta V (I_{read} / I_{read\_min}) \qquad \text{[Equation 6]}$$

thus, the worst case charge is:

$$Q_{max} = C\Delta V (I_{read\_max} / I_{read\_min}) \qquad \text{[Equation 7]}$$

and it is apparent that most accesses use more than the minimum power, since by definition:

$$I_{read} / I_{read\_min} \geq 1 \qquad \text{[Equation 8]}$$

The average energy dissipation therefore depends on the statistical distribution of the cell read currents. Unfortunately, the width of this distribution (i.e. the difference between $I_{read\_max}$ and $I_{read\_min}$) has been getting worse over time, as the size of the transistors used gets smaller.

A common feature of most modern memories is the use of a hierarchical bit line arrangement in which, instead of a single bit line that runs the complete height of a column of memory cells and connects to each cell in the column, a multi-level structure is used. Effectively, a single bit line is broken up into multiple "local bit lines", each of which connects to the memory cells in a part of the column. A "global bit line" also runs the height of the column, and is connected to the local bit lines via switches. The memory read and write circuits connect to the global bit line, and not directly to the local bit line. During a memory access, only a local bit line in the relevant part of the column is connected (via its local-to-global switch) to the global bit line.

In a memory unit, such as an SRAM, that uses bit line pairs in each column, each bit line in a pair can be replaced with such a hierarchical bit line circuit, thus there will be pairs of local bit lines that connect to pairs of global bit lines, as shown in FIG. 3. The switches between local and global bit lines have their own control signals that function in a similar way to the word lines in a non-hierarchical memory.

FIG. 4 shows the timing of a read operation of a memory such as that in FIG. 3. The access starts with both local and global bit lines pre-charged to high values. At time $t_1$, a word line goes high, and a switch control signal is also activated at approximately the same time. A differential voltage builds on both local and global bit lines. The voltage difference is larger on local bit lines due to the resistive coupling between local and global bit lines. At time $t_2$, the voltage difference on the global bit lines is large enough for reliable sensing, and at time $t_3$ the word line is deactivated, again with the switch control signal also being deactivated at around the same time. Finally, at time $t_4$, the local and global bit lines are pre-charged back to a high level ready for the next cycle.

The aim of the hierarchical bit line circuit is to reduce the total active capacitance due to the bit lines during a memory access, and consequently to reduce power dissipation and increase operating speed. Each memory cell connected to a bit line has a loading capacitance due to the presence of the transistor source/drain that makes the connection to the bit line. For the case of a single bit line that connects to all memory cells in a column, the total capacitance can become large, and each local bit line only sees a fraction of this load. The global bit line is loaded by the switches that connect the local and global bit lines, and each of these switches may have a larger capacitive load than an individual memory cell, but the global bit line connects to a small number of these switches rather than to all the memory cells directly, and so also has a smaller capacitive load than a single long bit line.

The effect of a hierarchical bit line can be estimated as follows. The capacitance of a local bit line ($C_L$) can be modelled as a constant ($C_1$), plus a term that depends on the number of cells connected to the local bit line ($N_C$) (for which the capacitance of the cells is $C_C$):

$$C_L = C_1 + C_C N_C \quad \text{[Equation 9]}$$

The capacitance of a global bit line ($C_G$) can be modelled as a constant ($C_2$), plus a term that depends on the number of local bit lines that it connects to ($N_B$):

$$C_G = C_2 + C_B N_B \quad \text{[Equation 10]}$$

wherein $C_B$ is the extra capacitance added to the global bit line in order to connect to the local bit line, and is largely dependent upon the parasitic capacitance of the switch between local and global bit lines.

The total capacitance seen by a memory cell during a read or write is:

$$C = C_L + C_G \quad \text{[Equation 11]}$$

$$C = (C_1 + C_2) + C_C N_C + C_B N_B \quad \text{[Equation 12]}$$

Therefore, C has a constant term, plus terms that depend on the number of cells per local bit line, and the number of local bit lines per global bit line.

The total number of cells per column, $N = N_B N_C$ is constant, so:

$$C = (C_1 + C_2) + C_C N_C + C_B N/N_C \quad \text{[Equation 13]}$$

This type of formula, with multiple dependencies on $N_C$, implies the existence of a minimum value of C, the position of which can be found by differentiation:

$$\frac{dC}{dN_C} = C_C - C_B N/N_C^2 = 0 \quad \text{[Equation 14]}$$

$$C_C = C_B N/N_C^2 \quad \text{[Equation 15]}$$

$$N_C^2 = N(C_B/C_C) \quad \text{[Equation 16]}$$

From which:

$$C_{min} = (C_1 + C_2) + C_C N^{1/2}(C_B/C_C)^{1/2} + C_B N^{1/2}(C_C/C_B)^{1/2} \quad \text{[Equation 17]}$$

In the case where the constant terms are small, $C_{min} \approx 2N^{1/2}(C_B C_C)^{1/2}$, and the capacitance depends on the capacitance of a single bit line connecting to every cell in the column is:

$$C_{col} \approx N C_C \quad \text{[Equation 18]}$$

such that:

$$C_{min}/C_{col} \approx (2/N^{1/2})(C_B/C_C)^{1/2} \quad \text{[Equation 19]}$$

That is, the ratio of hierarchical bit line capacitance to non-hierarchical bit line capacitance depends on the square root of the ratio of capacitance per local bit line to capacitance per cell, and the reciprocal of the square root of the number of cells in a column. A large capacity memory may have several thousand rows, so $N^{1/2} > 30$, while the ratio of the capacitances per bit line to per cell is typically less than 10, meaning its square root is 3 or less. Thus a significant reduction in active capacitance is obtained by using a hierarchical bit line.

The present invention provides an alternative method of operating a memory unit that has a hierarchical bit line arrangement so as to improve the control of the power dissipation of hierarchical bit lines, and therefore leads to reduced overall operating power for the memory unit.

Therefore, according to a first aspect there is provided a memory unit comprising a plurality of memory cells, each memory cell being associated with a wordline, the plurality of memory cells being grouped into a plurality of memory cell groups, each memory cell group having one or more local bit lines operatively connected to each of the memory cells in the memory cell group for which access to a memory cell is controlled by the associated wordline. The memory unit further comprises one or more global bit lines connected to a sense amplifier, the sense amplifier being configured to determine a data value stored in a memory cell in dependence upon the states of the one or more global bit lines. Each memory cell group is configured such that, when a memory cell of the memory cell group is being read, the one or more local bit lines of the memory cell group are provided as inputs to a logic circuit and are not connected to the global bit lines, the logic circuit being configured to cause a capacitance element to be connected to one of the one or more global bit lines in dependence upon the states of the one or more local bit lines of the memory cell group.

The capacitance element may be provided by a capacitor. Alternatively, the capacitance element may be provided by one or more local bit lines of one or more further memory cell groups of the memory unit, and the logic circuit can be configured to connect one of the one or more global bit lines of the memory cell group to one or more of the local bit lines of the one or more further memory cell groups. The logic circuit may be configured to connect one of the one or more global bit lines to the local bit lines of one or more further memory cell groups.

The memory cell group of the memory cell being read may be located within a column of the memory unit, and the capacitance element can be provided by one or more of the local bit lines of an adjacent memory cell group that is located within the same column of the memory unit. Alternatively, the memory cell being read may be located within a row of the memory unit, and the capacitance element can then be provided by one or more further memory cell groups for which at least one of the memory cells in each of one or more further memory cell groups is located within the same row of the memory unit.

The logic circuit may be configured to connect one of the one or more global bit lines to the local bit lines of one or more further memory cell groups for which at least one of the memory cells in each of one or more further memory cell groups share a wordline with the memory cell group of the memory cell that is being read.

The logic circuit may comprise, for each global bit line, a first transistor and a second transistor connecting the global bit line to the local bit lines of the one or more further memory cell groups, a gate of the first transistor being connected to a local bit line of the memory cell group and a gate of the second transistor being connected to a switch control line. The first transistor can be a PMOS transistor.

The memory unit may further comprise a local bit line selection circuit configured to control which of the local bit lines can be connected to the global bit line via the logic circuit.

The local bit lines of the memory cell group and the one or more further memory cell groups may be each operatively connected to a shared wire via a switch, the switches being controlled by the local bit line selection circuit, and the shared wire being operatively connected to the global bit lines via the logic circuit. Each of the switches connecting the local bit lines of each of the memory cell group and the one or more further memory cell groups to the shared wire can be configured to be activated by a corresponding column select signal provided by the local bit line selection circuit.

The local bit line selection circuit may be configured such that, when a memory cell of the memory cell group is being read, the one or more local bit lines of the memory cell group are not connected to the shared wire. The local bit line selection circuit may be configured such that, when a memory cell of the memory cell group is being read, only the local bit lines of each of the one or more further memory cell groups are connected to the shared wire.

The memory unit may further comprise a pre-charge voltage control circuit comprising a switch controlled by a control signal that operatively connects a pre-charge voltage supply to the shared wire. The memory unit may further comprise a capacitance control circuit comprising a switch controlled by a control signal that operatively connects an additional capacitance element to the shared wire. The memory unit may further comprise a feedback control circuit configured to detect an error in a data value read from a memory cell by the sense amplifier and to vary the control signal for the memory cells associated with the sense amplifier in dependence upon a monitored error rate.

The feedback control circuit may comprise an error detecting circuit, a monitor circuit and a latch, the error detecting circuit being configured to detect an error in a data value read from a memory cell by the sense amplifier and to report an error to the monitor circuit, the monitor circuit being configured to determine when a monitored error rate of the sense amplifier exceeds a threshold and to then cause a change in state of the latch, the output of the latch being provided as the control signal.

The memory unit may have first and second global bit lines that are connected to the logic circuit, and each memory cell group may have first and second local bit lines that are operatively connected to each of the memory cells in the memory cell group and that are connected as inputs to the logic circuit, the logic circuit being configured to cause the capacitance element to be connected to one or other of the first and second global bit lines in dependence upon the states of the first local bit line and the second local bit line of the memory cell group.

According to a second aspect there is provided a method for reading a data value stored in a memory cell of a plurality of memory cells that are part of a memory unit, the memory cells being grouped into a plurality of memory cell groups, wherein each memory cell group is associated with one or more local bit lines. The method comprises the steps of (i) pre-charging the one or more local bit lines associated with the memory cell to a first voltage level, (ii) connecting the one or more local bit lines to the memory cell such that the voltage level of one of the one or more local bit lines is then dependent upon the data value stored in the memory cell, and (iii) disconnecting the one or more local bit lines from the memory cell. The method then comprises the steps of (iv) causing a capacitance element to be connected to one of one or more global bit lines in dependence upon the state of the one or more local bit lines, and (v) without connecting the one or more local bit lines to either of the one or more global bit lines, sensing a voltage on the one or more global bit lines to determine the data value.

The local bit lines may be disconnected from the memory cell before or approximately concurrently with the connecting of the capacitance element to one of the one or more global bit lines.

The method may further comprises detecting an error in a data value read from a memory cell by a sense amplifier, determining an error rate for the sense amplifier, and, when the determined error rate exceeds a threshold, varying one or more of the capacitances and the pre-charge voltages for the memory cells associated with the sense amplifier.

According to a third aspect there is provided a memory unit comprising a plurality of memory cells, each memory cell being associated with a wordline, the plurality of memory cells being grouped into a plurality of memory cell groups, each memory cell group having one or more local bit lines operatively connected to each of the memory cells in the memory cell group for which access to a memory cell is controlled by the associated wordline. The memory unit further comprises one or more global bit lines connected to a sense amplifier, the sense amplifier being configured to determine a data value stored in a memory cell in dependence upon the states of the one or more global bit lines. The one or more local bit lines of a memory cell group are connected to a logic circuit, and the logic circuit is configured to cause a capacitor to be connected to one of the one or more global bit lines in dependence upon the states of the one or more local bit lines of the memory cell group.

The logic circuit may be configured to be controlled by a combination of a switch control signal, and the states of the one or more local bit lines of a memory cell group. Each of the one or more local bit lines of a memory cell group may be operatively connected to a respective one of the one or more global bit lines via a switch that is configured to be activated by the switch control signal.

According to a fourth aspect there is provided a method for reading a data value stored in a memory cell of a plurality of memory cells that are part of a memory unit, the memory cells being grouped into a plurality of memory cell groups, wherein each memory cell group is associated with one or more local bit lines. The method comprises the steps of (i) pre-charging the one or more local bit lines associated with the memory cell to a first voltage level, (ii) connecting the one or more local bit lines to the memory cell such that the voltage level of one of the one or more local bit lines is then dependent upon the data value stored in the memory cell, and (iii) disconnecting the one or more local bit lines from the memory cell. The method then comprises the steps of (iv) causing a capacitor to be connected to one of one or more global bit lines in dependence upon the state of the one or more local bit lines and (v) sensing a voltage on the one or more global bit lines to determine the data value.

According to a fifth aspect there is provided a memory unit comprising a plurality of memory cells, each memory cell being associated with a wordline, the plurality of memory cells being grouped into a plurality of memory cell groups, each memory cell group having one or more local bit lines operatively connected to each of the memory cells in the memory cell group for which access to a memory cell is controlled by the associated wordline. The memory unit further comprises one or more global bit lines connected to a sense amplifier, the sense amplifier being configured to determine a data value stored in a memory cell in dependence upon the states of the one or more global bit lines. The one or more local bit lines of a memory cell group are connected to a logic circuit, and the logic circuit is configured to cause one or more of the local bit lines of an adjacent memory cell group that does not share a wordline with memory cell group to be connected to one of the one or more global bit lines in dependence upon the states of the one or more local bit lines of the memory cell group.

The plurality of memory cells may be provided in one or more columns of the memory unit, the memory cells within each of the one or more columns being grouped into a plurality of memory cell groups, and the logic circuit may be configured to cause one or more of the local bit lines of an adjacent memory cell group within the same column of the memory unit to be connected to one of the one or more global bit lines in dependence upon the states of the one or more local bit lines of the memory cell group.

The each of the one or more local bit lines of a memory cell group may be operatively connected to a respective one of the one or more global bit lines via a switch that is configured to be activated by a switch control signal. The logic circuit may be configured to be controlled by a combination of the switch control signal and the states of the one or more local bit lines of a memory cell group.

According to a sixth aspect there is provided a method for reading a data value stored in a memory cell of a plurality of memory cells that are part of a memory unit, the memory cells being grouped into a plurality of memory cell groups, wherein each memory cell group is associated with one or more local bit lines. The method comprises the steps of (i) pre-charging the one or more local bit lines associated with the memory cell to a first voltage level, (ii) connecting the one or more local bit lines to the memory cell such that the voltage level of one of the one or more local bit lines is then dependent upon the data value stored in the memory cell, and (iii) disconnecting the one or more local bit lines from the memory cell. The method then further comprises the steps of (iv) causing one or more of the local bit lines of an adjacent memory cell group that does not share a wordline with memory cell group to be connected to one of one or more global bit lines in dependence upon the state of the one or more local bit lines, and (v) sensing a voltage on the one or more global bit lines to determine the data value.

The present invention will now be more particularly described by way of example only with reference to the accompanying drawings, in which:

FIGS. 10a and 10b illustrate further embodiments of an improved memory unit having a hierarchical bit line arrangement;

FIGS. 11a and 11b illustrate yet further alternative embodiments of an improved memory unit having a hierarchical bit line arrangement;

Figure 15A:
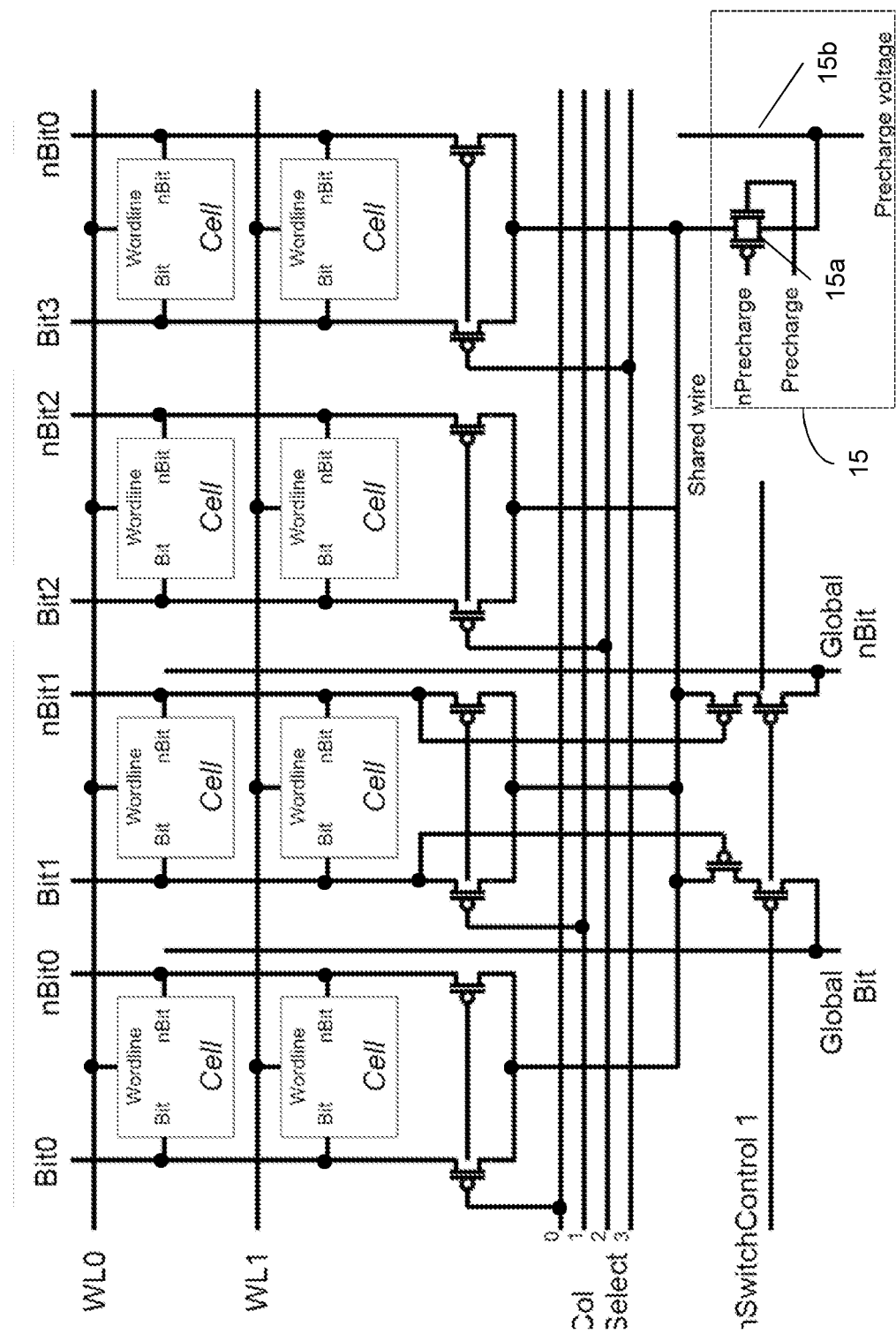
Figure 16A:
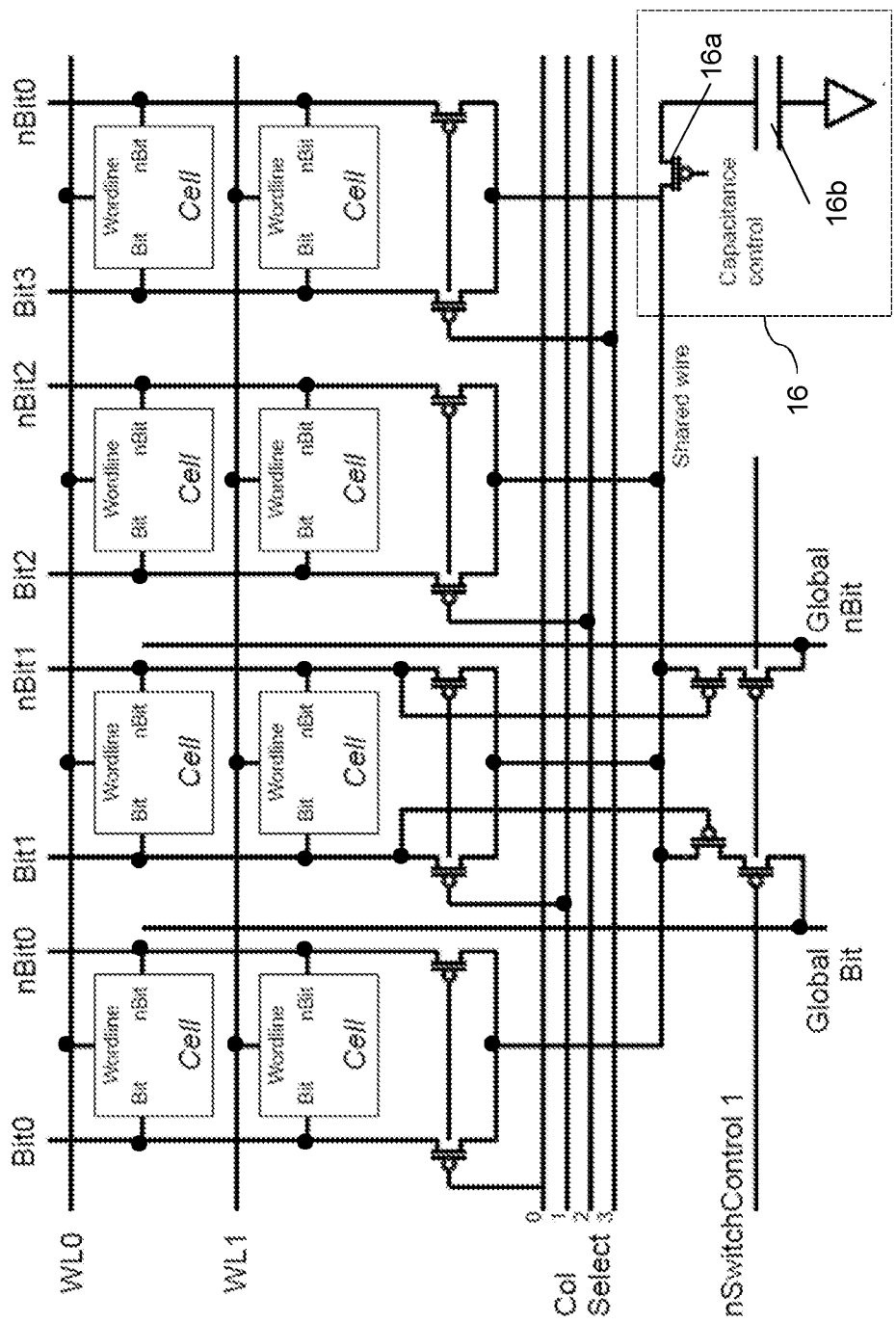
Figure 16B:
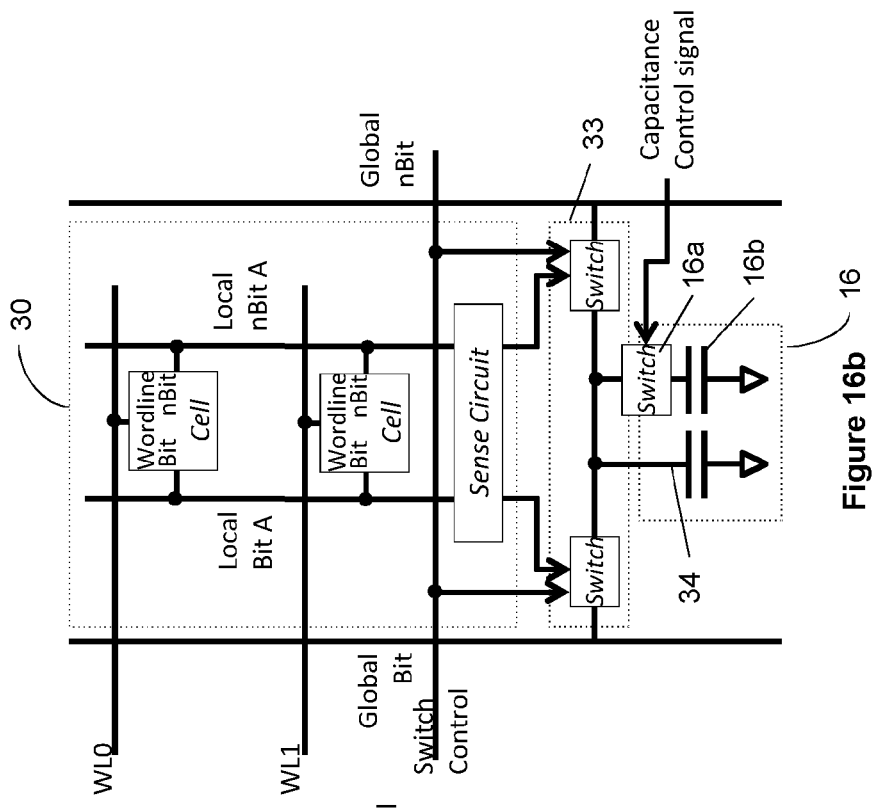
Figure 16C:
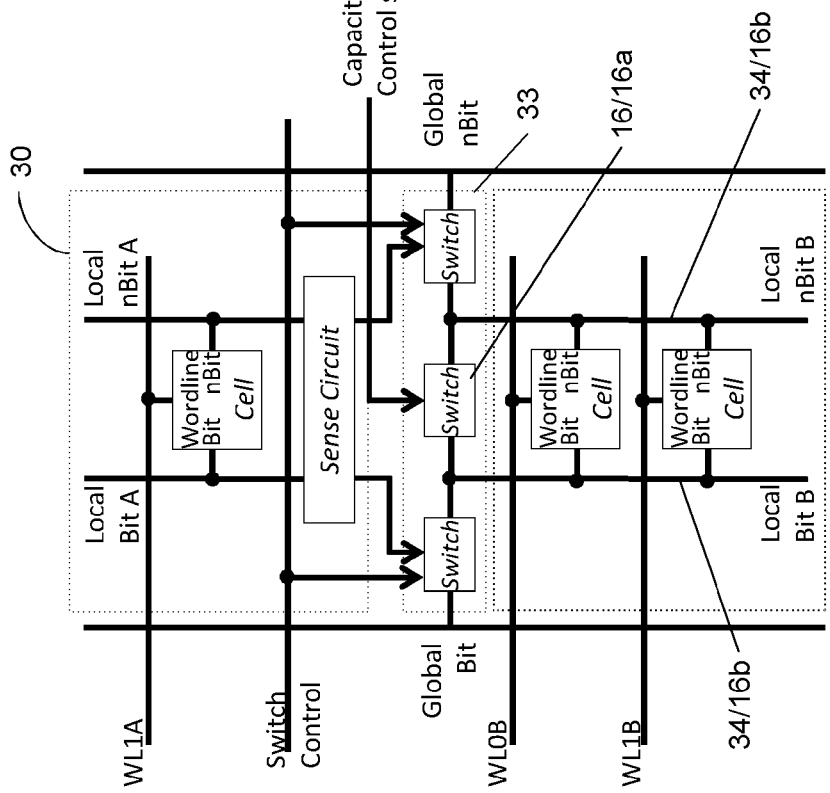
Figure 17:
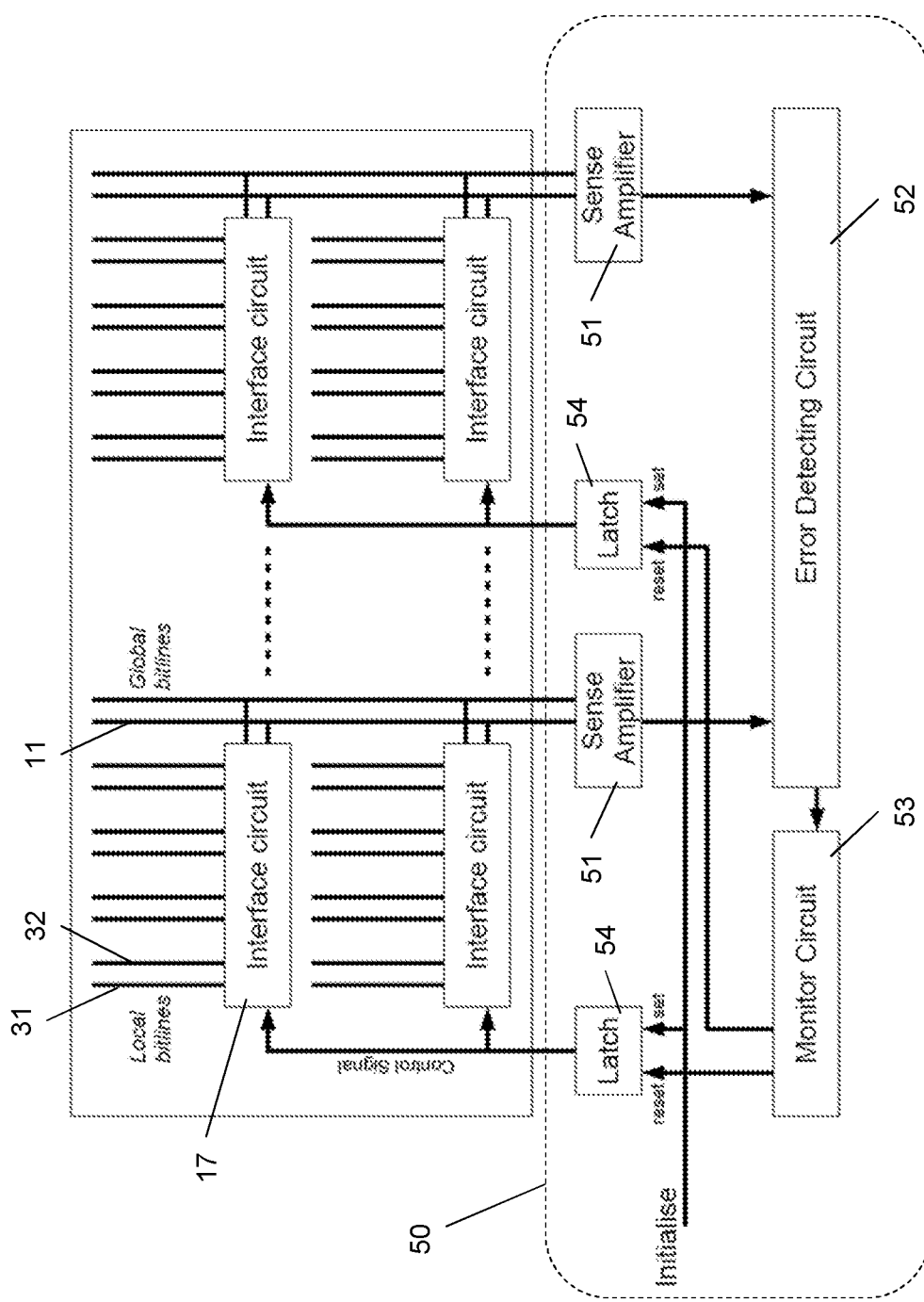

FIGS. 15a, 15b, and 15c illustrate embodiments of improved memory units that include a pre-charge voltage control circuit;

FIGS. 16a, 16b, and 16c illustrate embodiments of improved memory units that include a capacitance control circuit; and FIG. 17 illustrates an embodiment of an improved memory unit that includes control circuitry for tuning a memory unit to the properties of a particular sense amplifier.

As described above, in the standard read operation of a memory unit that has a hierarchical bit line arrangement, the switch that connects local and global bit lines is operated at approximately the same time as the word line goes high to connect a memory cell to the local bit line. The memory cell then draws current from both local and global bit lines in order to create a voltage change on the global bit line.

Figure 1:
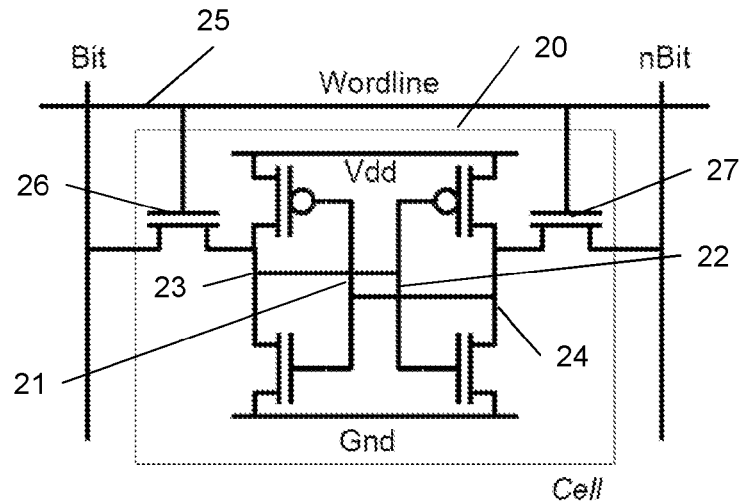
FIG. 1 illustrates a standard 6-transistor memory cell.
Figure 2:
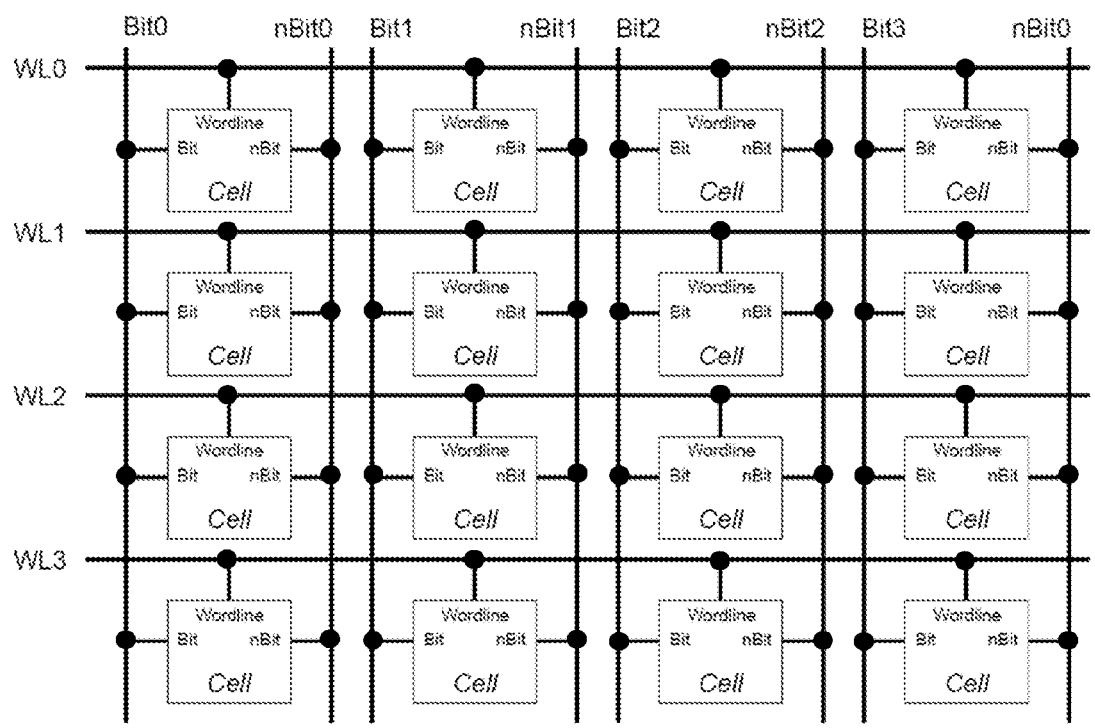
FIG. 2 illustrates a block of 6-transistor memory cells.
Figure 3:
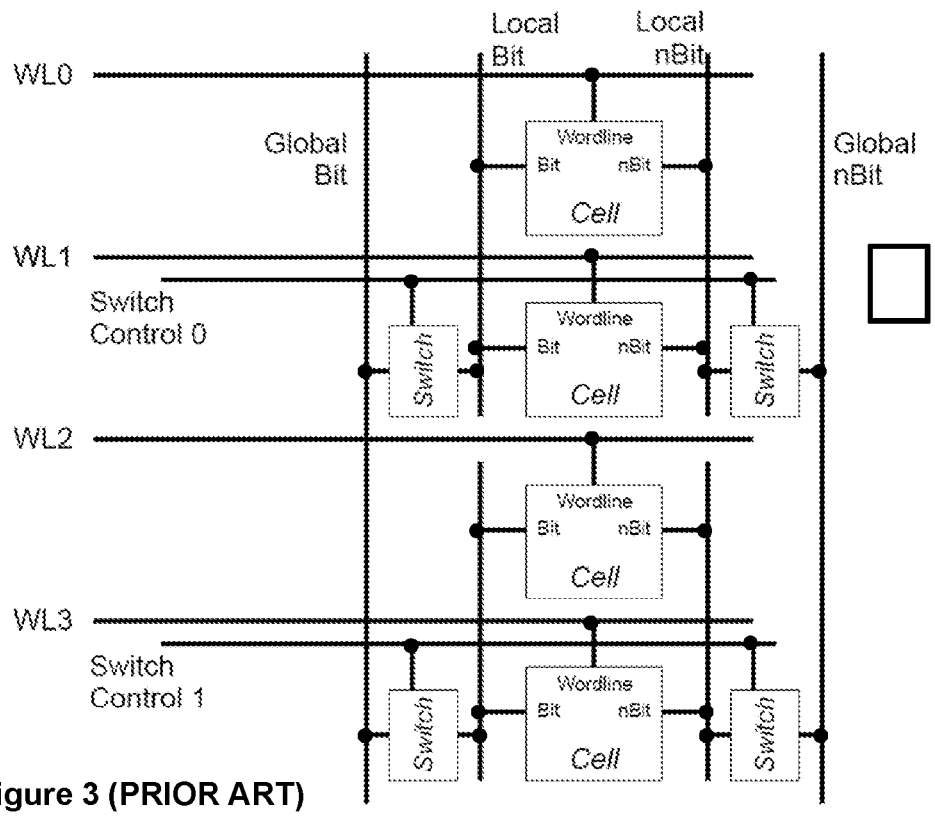
FIG. 3 illustrates a memory unit with hierarchical bit line arrangement.
Figure 4:
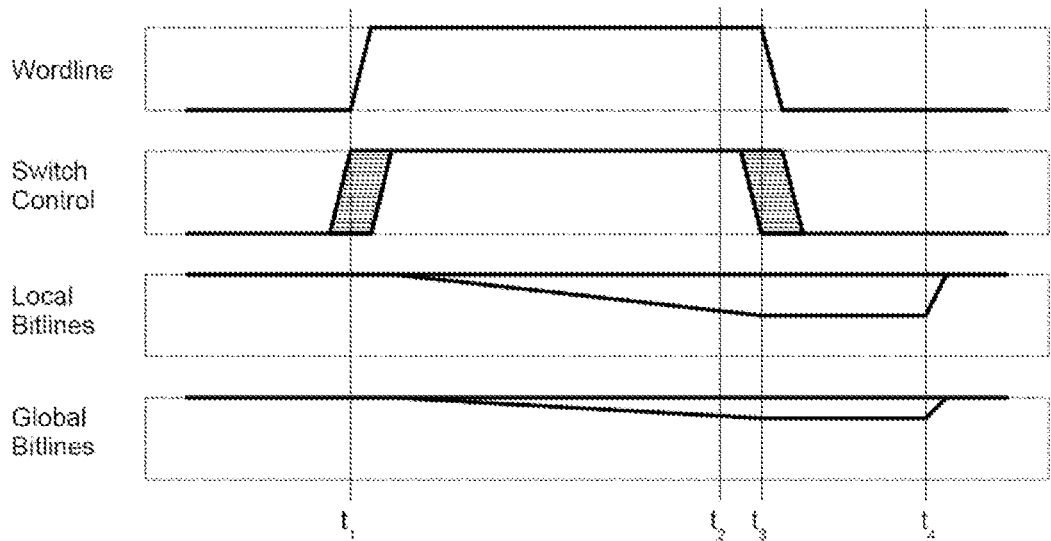
FIG. 4 is a timing diagram illustrating a standard read operation for a memory unit having hierarchical bit line arrangement.
Figure 5:
FIG. 5 is a timing diagram illustrating an alternative read operation for a memory unit having hierarchical bit line arrangement.

Referring now to FIG. 5, there is shown a timing diagram illustrating an embodiment of an alternative read operation for a memory unit that has a hierarchical bit line arrangement in which the timing of the activation of the switch between local and global bit lines is changed. In doing so, this alternative read operation relies on charge sharing between the local and global bit lines. Charge sharing is a common technique for generating voltage levels in many circuits. It works by charging two capacitance elements to different voltage levels, and then connecting the two capacitance elements together (in parallel) and allowing them to settle to a new voltage. Charge is conserved in this process, and shared between the two capacitance elements.

Given two capacitance elements with respective capacitances $C_1$ and $C_2$, charged to voltages $V_1$ and $V_2$ respectively, the stored charges will be $Q_1=C_1 V_1$ and $Q_2=C_2 V_2$. When connected together, the resulting voltage, V, will be given by:

$$Q_1+Q_2=(C_1+C_2)V \quad \text{[Equation 20]}$$

$$V=(C_1V_1+C_2V_2)/(C_1+C_2) \quad \text{[Equation 21]}$$

Appropriate choices of $C_1$ and $C_2$ allow for the generation of any voltage between $V_1$ and $V_2$. For instance, if $V_2=0$, and $C_1=C_2$, then $V=\frac{1}{2}V_1$. If $C_1 \ll C_2$, and $V_2=0$, then $V \approx (C_1/C_2)V1$. If $C_1 \ll C_2$, and $V_1=0$, then $V \approx (1-(C_1/C_2))V_2$.

In the timing diagram of FIG. 5, the local and global bit lines are initially all pre-charged high. At time $t_1$ the word line is driven high. However, contrary to the standard read operation, the switch control signal (which controls the local-to-global switch) remains deactivated, so that the local and global bit lines are isolated from each other. The selected cell therefore only draws current from a local bit line and not the global line also. It can therefore create a faster voltage swing on the local bit lines alone than it could on the global bit line.

Then, at time $t_{1a}$ the word line is turned off, so that the cell is isolated from the local bit line. At this point, a large voltage difference exists on the local bit line. From this time onwards until the end of the read operation cycle, no further significant current is drawn from the bit lines by the memory cell.

At time $t_{1b}$ the switch control signal is activated, so that the local bit line is now connected to the global bit line. Charge sharing takes place between local and global bit lines, resulting in a global bit line voltage difference that can be sensed by the sense amplifier at time $t_2$. At time $t_3$ the switch control signal is deactivated, and at time $t_4$ the local and global bit lines are returned to their pre-charged state ready for the next access.

The key feature of this alternative read operation are that the word line turns on significantly before the switch control turns on, and that the word line turns off before (or approximately concurrently with) the turning on of the switch control. Consequently, the memory cell is disconnected from the local bit lines before (or approximately concurrently) with the connection of the local bit lines to the global bit lines.

Using this method, the short, relatively low capacitance local bit line allows the bit line voltage swing to be a large fraction of the supply voltage range in a short time. This is useful, as it makes the voltage swing on the local bit line self-limiting, and helps to limit power dissipation. In particular, the connection between the memory cell and the local bit line is resistive, such that the actual current flowing depends on the voltage difference between the memory cell and the local bit line. It is not possible for the memory cell to pull the local bit line below the memory cell internal voltage, which is usually 0V. Therefore, irrespective of the initial value of the memory cell current, the voltage swing on the local bit line will be limited to fully discharging it. For example, if the local bit line is pre-charged to the supply voltage, $V_{dd}$, then the maximum voltage swing is $V_{dd}$, and the maximum charge moved is $C_L V_{dd}$.

Bit line timing is set so that the slowest cells can achieve a large voltage swing (e.g. approximately $V_{dd}$) in the available time, and the total voltage swing for any faster memory cell is limited to $V_{dd}$. A fixed amount of charge on a local bit line then means that the charge on the associated global bit line will be moved by a fixed amount, independently of the strength of the cell. If the global bit line has a capacitance $C_G$ and an initial voltage of $V_P$ (the pre-charge voltage), then when connected to a fully discharged local bit line its new voltage will be (from the preceding formulas for charge sharing):

$$V=C_G/(C_G+C_L)V_P \quad \text{[Equation 22]}$$

A change of:

$$\Delta V=V_P-V=C_L/(C_G+C_L)V_P \quad \text{[Equation 23]}$$

For correct operation of the memory, this value of $\Delta V$ must be large enough to achieve correct sensing by the sense amplifier. The required sense amplifier input differential effectively acts as a limit on the ratio of local and global bit line capacitance:

$$\Delta V_{sense}<\Delta V=V_P-V=C_L/(C_G+C_L)V_P \quad \text{[Equation 24]}$$

$$\Delta V_{sense}/V_P<C_L/(C_G+C_L) \quad \text{[Equation 25]}$$

$$V_P/\Delta V_{sense}>(C_G+C_L)/C_L=1+(C_G/C_L) \quad \text{[Equation 26]}$$

$$(C_G/C_L)<V_P/\Delta V_{sense}-1 \quad \text{[Equation 27]}$$

$$(C_G/C_L)\geq V_P/V_{sense} \quad \text{[Equation 28]}$$

$$C_L/C_G\geq \Delta V_{sense}/V_P \quad \text{[Equation 29]}$$

One disadvantage of the alternative read operation described above is that it is slower than the standard approach of connecting local and global bit lines whilst the word line is active. This is because of the resistive nature of the connection between memory cell and the bit lines, such that the current flow depends on the voltage difference. In the standard approach, the average voltage difference is higher, and so the average current is higher, and the time taken to move a given amount of charge in order to achieve a particular voltage swing on the global bit line is lower.

Figure 6:
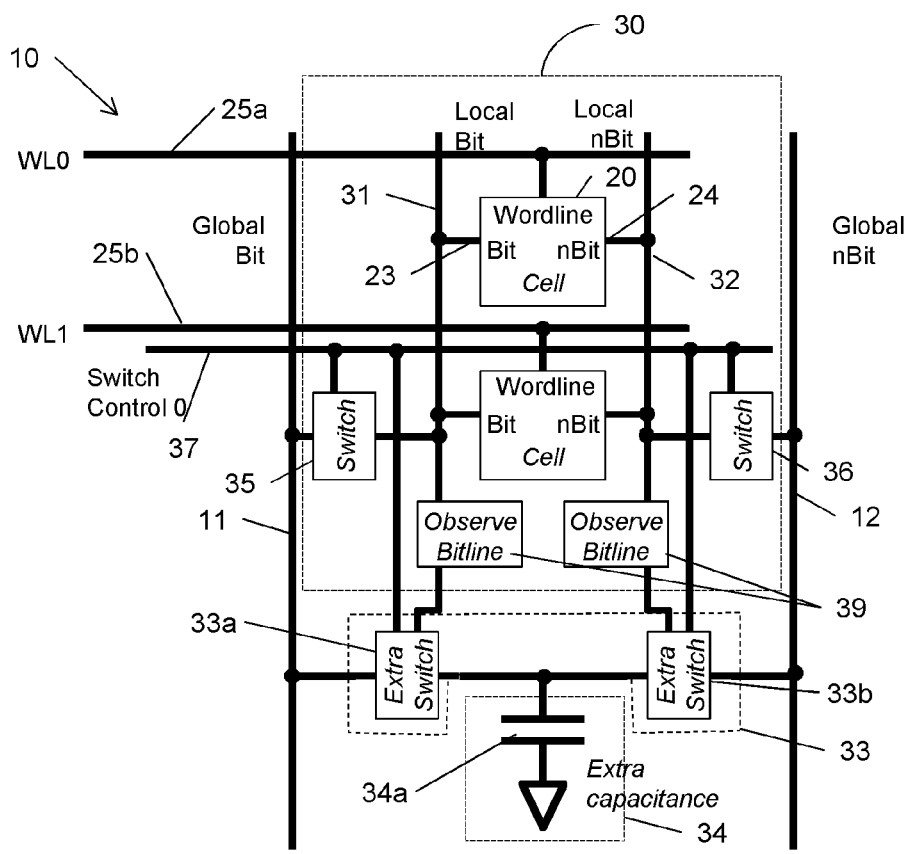
FIG. 6 illustrates an embodiment of an improved memory unit having a hierarchical bit line arrangement.

Whilst this problem could be addressed by reducing the capacitance of the local bit line, thereby providing that it will discharge faster, it would not then have a large enough capacitance to cause a large enough swing on the global bit line for reliable sensing. However, it is recognised herein that the local bit line will have a large enough voltage swing to reliably activate a switching circuit/logic circuit, and that a switching circuit/logic circuit connected to the local bit lines can therefore observe the state of the local bit lines. It is therefore proposed herein that a local bit line is connected as an input to a logic circuit/switching circuit, wherein the logic circuit/switching circuit is arranged to cause an extra, already discharged capacitance element to be connected to the global bit line in dependence upon the state of the local bit line. This additional capacitance thereby makes up for the reduction in local bit line capacitance and restores the necessary voltage swing to the local bit line. FIG. 6 illustrates an embodiment of such an improved memory unit having a hierarchical bit line arrangement.

FIG. 6 illustrates a memory unit 10 that has a memory cell group 30 of two separate memory cells 20 that are each associated with a word line 25. The memory cell group 30 also has a pair of local bit lines 31, 32 that are operatively connected to each of the memory cells 20 in the memory cell group 30. Access by the local bit lines 31, 32 to each of the memory cells is controlled by the associated word lines 25a, 25b. The memory unit 10 also has a pair of global bit lines 11, 12 that are connected to a sensing circuit (not shown) that is configured to determine a data value stored in a memory cell 20 in dependence upon the states of the global bit lines 11, 12. A switch control signal (provided by the switch control line 37) is used to control two local-to-global switches 35, 36 that operatively connect each of the local bit lines 31, 32 to the respective global bit lines 11, 12. The states local bit lines 31, 32 are provided as inputs to a switching circuit/logic circuit 33 that is configured to cause a capacitance element 34, provided by a capacitor 34a, to be connected to one or other global bit lines 11, 12 in dependence upon the states of the local bit lines 31, 32.

In this embodiment, the switching circuit/logic circuit 33 comprises two extra switches 33a, 33b that are controlled by a combination of the switch control signal 37 and the observed states of the respective local bit line (i.e. whether or not it was discharged while the word line was high). In this embodiment, the states of the respective local bit lines are observed by respective local bit line observation circuits 39. In this regard, the local bit line observation circuits 39 are functionally similar to a sense amplifier (i.e. it detects the state of the bit line); however, the structure of the observation circuit can be much simpler than that of a standard sense amplifier, due to the large voltage swing on the local bit line. Alternatively, the observed state of the respective local bit line can be provided by the voltage stored by the capacitance of the local bit line itself. Therefore, as part of a read operation, not only are the local bit lines 31, 32 connected to the respective global bit lines 11, 12 (i.e. by the activation of the switch control signal 37), but the logic circuit/switching circuit 33 also causes an extra, already discharged capacitance element 34, provided by a capacitor 34a, to be connected to the one of the global bit lines in dependence upon the state of the local bit lines.

Whilst the memory unit of this embodiment is illustrated as having memory cell groups that are comprised of two separate memory cells, this is a purely illustrative example, as the memory cell groups are not limited to two memory cells and may each comprise two or more memory cells.

This improved memory unit enables an acceptable level of performance to be maintained when implementing the reduced power read operation. By way of example, the local bit line could be halved in capacitance (e.g. by halving the length) compared to the value obtained from the inequality given in equation 29, and a capacitance element having twice the capacitance of the local bit line could then be used to provide the voltage swing. This would then give a similar operating speed to that achieved using standard read operation for a conventional hierarchical bit line arrangement, but with reduced power usage due to the current limiting effect of the local bit line as described above.

Figure 7:
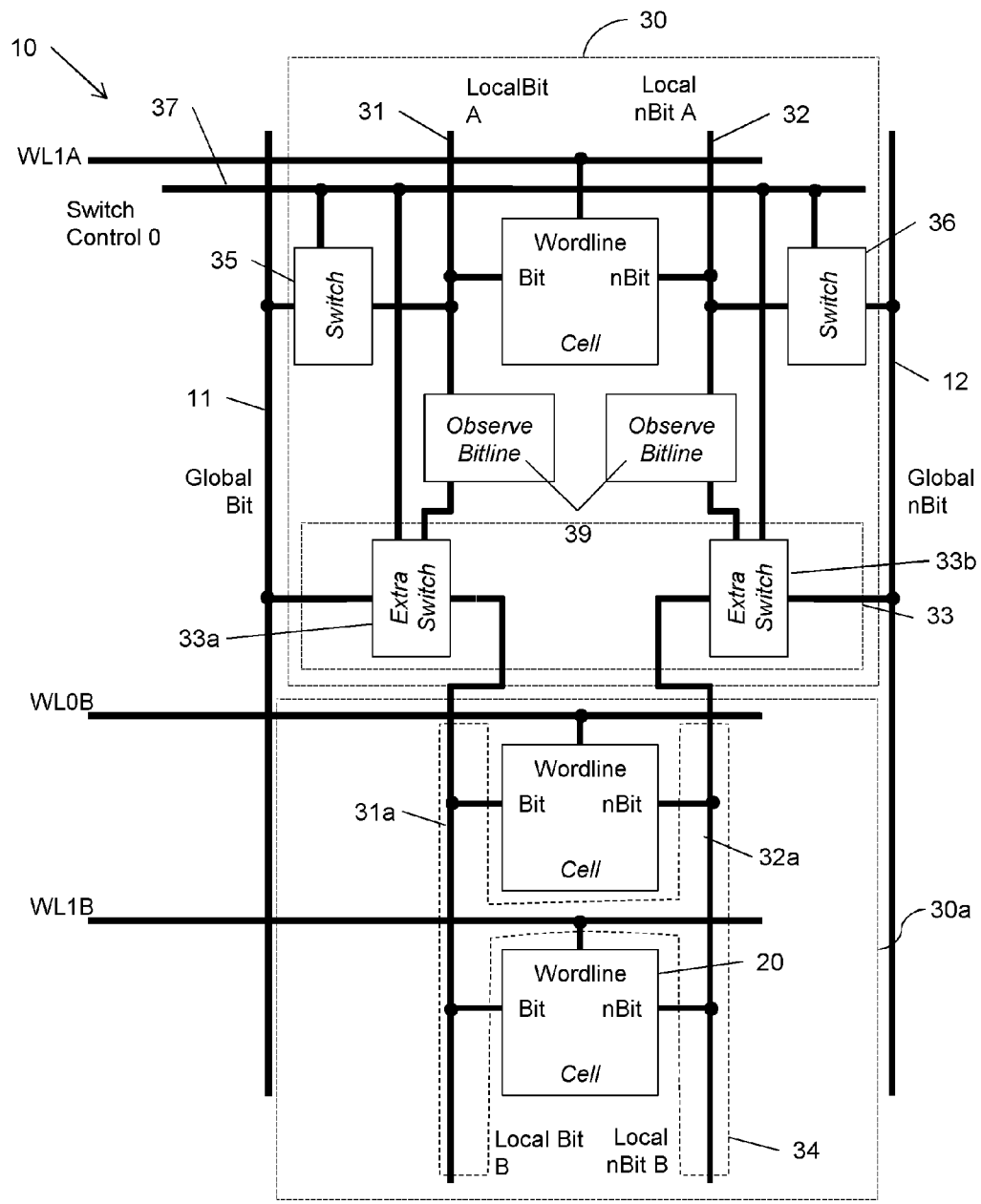
FIG. 7 illustrates an alternative embodiment of an improved memory unit having a hierarchical bit line arrangement.

FIG. 7 illustrates an alternative embodiment of an improved memory unit 10 having a hierarchical bit line arrangement, in which the additional capacitance element 34 is provided by one or more local bit lines 31a, 32a of an adjacent memory cell group 30a. The arrangement of this memory unit 10 is substantially similar to that illustrated in FIG. 6; however, the switching circuit/logic circuit 33 is configured to cause the local bit lines 31a, 32a of an adjacent memory cell group 30a that does not share a wordline with memory cell group 30 (e.g. a memory cell group within the same column of the memory unit) to one or other of the global bit lines 11, 12 in dependence upon a combination of a switch control signal (i.e. provided over the switch control line 37) and the observed states of the local bit lines 31, 32 associated with the memory cell being read. The local bit lines 31a, 32a of the adjacent memory cell group 30a therefore provide the capacitance element 34.

The above-described use of the local bit lines of an adjacent memory cell group during a read operation also provides that the global bit line voltage can be controlled, such that the power required for a read operation can be reduced. In addition, this use of the local bit lines of an adjacent memory cell group makes use of the existing components of the memory unit (i.e. the local bit lines of neighbouring memory cell groups) to provide the capacitance, such that an additional capacitor is not required, thereby minimising the area consumed by the memory unit.

Again, whilst the memory unit of this embodiment is illustrated as having memory cell groups are comprised of two separate memory cells, this is a purely illustrative example, as the memory cell groups are not limited to two memory cells and may each comprise two or more memory cells.

Preferably, when implementing a read operation for the memory unit of this embodiment, the local and global bit lines will be pre-charged to different voltages, as this guarantees that the local bit line(s) used as the extra capacitance are at a voltage that will cause an increased movement of the charge from the global bit line. By way of example, FIGS. 8 and 9 are timing diagrams illustrating two alternative embodiments of the read operation implemented for a memory unit as illustrated in FIG. 7.

Figure 8:
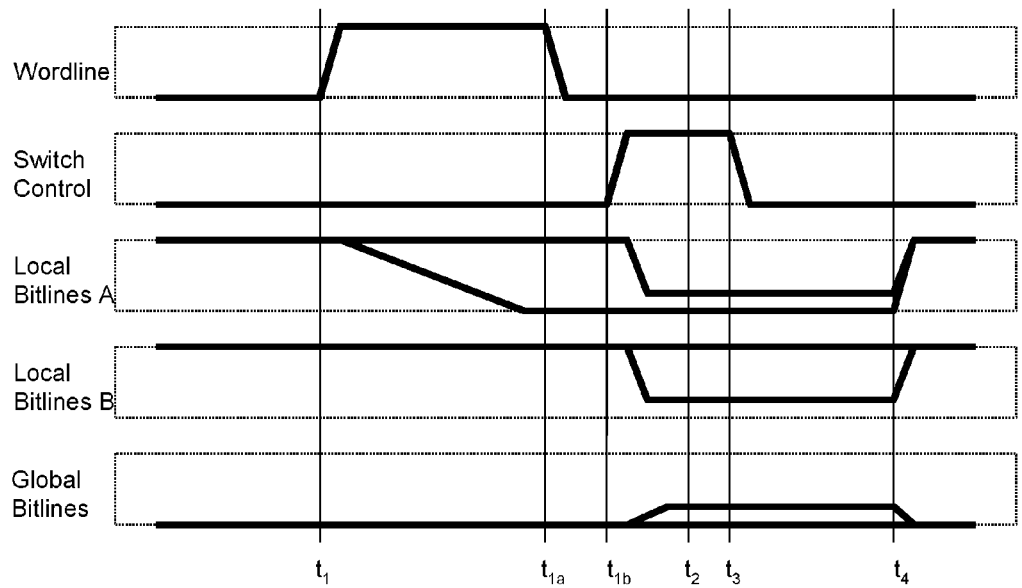
FIG. 8 is a timing diagram illustrating an embodiment for a read operation of a memory cell of an improved memory unit.

FIG. 8 illustrates a read operation of a memory cell in which the local bit lines are pre-charged high and global bit lines are pre-charged low. As in the read operation illustrated in FIG. 5, at time $t_1$ a word line is driven high. This word line allows the pair of local bit lines (A) of a memory cell group of which the memory cell is a part to connect the memory cell. The switch control signal remains deactivated, such that the local and global bit lines are isolated from each other. At time $t_{1a}$ the word line is turned off, such that the memory cell is isolated from the local bit line. At this point, a large voltage difference exists on the local bit lines (A) of the memory cell group of which the memory cell is a part, whilst the local bit lines (B) associated with an adjacent memory cell group are still at their pre-charge level.

At time $t_{1b}$ the switch control signal is activated. The local bit lines (A) of the memory cell group of which the memory cell is a part are now connected to the global bit lines. Also, in dependence upon the states of the local bit lines (A) of the memory cell group of which the memory cell is a part, one of the local bit lines (B) associated with an adjacent memory cell group is connected to one of the global bit lines. Charge sharing therefore takes place between the local and global bit lines that are connected, resulting in a global bit line voltage difference that can be sensed by the sense amplifier at time $t_2$. At time $t_3$ the switch control signal is deactivated, and at time $t_4$ the local and global bit lines are returned to their pre-charged state ready for the next access.

Figure 9:
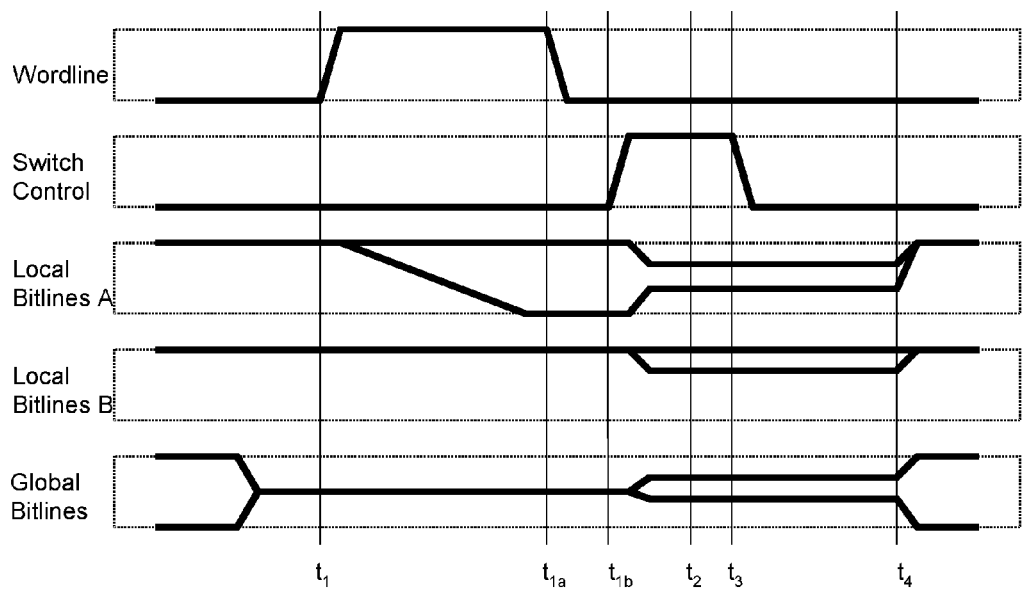
FIG. 9 is a timing diagram illustrating an alternative embodiment for a read operation of a memory cell of an improved memory unit.

FIG. 9 illustrates a similar read operation in which the local bit lines are pre-charged high and the global bit lines are pre-charged to $\frac{1}{2}V_{dd}$. This can be achieved by pulling one of the global bit lines in each pair to $V_{dd}$ and the other to ground at the end of each access operation. At a point early in an access operation (shown in FIG. 9 as before the word line is activated) the two global bit lines are connected together, and share charge to reach a common voltage midway between their two levels.

As an alternative, more than one bit line of a further memory cell group could be used as the extra capacitance element. For example, both the true and complement bit lines (Bit and nBit) from an adjacent memory cell group could be used. This can be viewed as each bit line having a third of the required capacitance, with two being used as the extra capacitance to increase the voltage swing. As a further alternative, the amount of additional capacitance used could be varied. For example, a memory unit could be configured to normally use one additional local bit line as the additional capacitance element, but to increase this to two when needed (e.g. in order to operate the memory at a lower voltage).

FIGS. 10a and 10b illustrate further embodiments of an improved memory unit having a hierarchical bit line arrangement.

In this regard, FIG. 10a illustrates a memory unit 10 that is substantially the same as that illustrated in FIG. 6; however, unlike the memory unit illustrated in FIG. 6, the memory unit 10 of FIG. 10a does not include local-to-global switches in the read path that connect the local bit lines 31, 32 to the global bit lines 11, 12 during a read operation. As with the memory unit of FIG. 6, in the memory unit of FIG. 10a the states of the local bit lines 31, 32 are provided as inputs to a switching circuit/logic circuit 33 that is configured to cause a capacitance element 34, provided by a capacitor 34a, to be connected to one or other global bit lines 11, 12 in dependence upon the states of the local bit lines 31, 32.

In the embodiment of FIG. 10a, the switching circuit/logic circuit 33 comprises two switches 33a, 33b that are each controlled by a combination of a switch control signal (i.e. provided over the switch control line 37) and the observed state of the respective local bit line (i.e. whether or not it was discharged while the word line was high). Therefore, unlike a conventional memory unit having a hierarchical bitline arrangement, the local bit lines 31, 32 of the memory cell group 30 are not connected to the global bit lines 11, 12 during a read operation (i.e. no charge flows between the local bit lines and the global bit lines), but are merely provided as the inputs to the switching/logic circuit 33. The switching/logic circuit 33 is then configured to cause the capacitor 34a to be connected to one of the one or more global bit lines 11, 12 in dependence upon the states of the local bit lines 31, 32.

It is noted that, whilst not essential, the switch control signal is preferably used in order to control when the capacitance is connected to one or other of the local bit lines. In particular, without the switch control signal it would be difficult for the switching/logic circuit 33 to clearly distinguish between a read operation and a write operation, and could potentially trigger the connection of the capacitor 34a to the global bit lines 11, 12 during a write operation.

The above-described use of a capacitor during a read operation provides that the global bit line voltage can be controlled even if there is a large spread in the memory cell read currents, such that the power required for a read operation can be reduced.

FIG. 10b illustrates an alternative embodiment of an improved memory unit 10 that is substantially the same as that illustrated in FIG. 10a; however, rather than having a local bit line observation circuit 39 for each of the local bit lines, the memory unit 10 can be provided with a local sense circuit/amplifier 39a that is connected to both of the local bit lines 31, 32 of the memory cell group 30. The local sense circuit/amplifier 39a is then configured to determine the states of the local bit lines 31, 32 and provide inputs to the switching circuit/logic circuit 33 in accordance with the states of the local bit lines 31, 32.

FIG. 11a illustrates a further alternative embodiment of an improved memory unit 10 having a hierarchical bit line arrangement that is substantially the same as that illustrated in FIG. 7; however, unlike the memory unit illustrated in FIG. 7, the memory unit 10 of FIG. 11a does not include local-to-global switches that connect the local bit lines 31, 32 to the global bit lines 11, 12.

Once again, unlike a conventional memory unit having a hierarchical bit line arrangement, the local bit lines 31, 32 of the memory cell group 30 are not connected to the global bit lines 11, 12 (i.e. no charge flows between the local bit lines and the global bit lines), but are merely provided as the inputs to the switching/logic circuit 33. The switching/logic circuit 33 is then configured to cause the local bit lines 31a, 32a of an adjacent memory cell group 30a that does not share a word-line with memory cell group 30 (e.g. a memory cell group within the same column of the memory unit) to be connected to one or other global bit lines 11, 12 in dependence upon a combination of a switch control signal (i.e. provided over the switch control line 37) and the observed states of the local bit lines 31, 32. The local bit lines 31a, 32a of the adjacent memory cell group 30a therefore provide the capacitance element 34.

FIG. 11b illustrates an alternative embodiment of an improved memory unit 10 that is substantially the same as that illustrated in FIG. 11a; however, rather than having a local bit line observation circuit 39 for each of the local bit lines, the memory unit 10 can be provided with a local sense circuit/amplifier 39a that is connected to both of the local bit lines 31, 32 of the memory cell group 30. The local sense circuit/amplifier 39a is then configured to determine the states of the local bit lines 31, 32 and provide inputs to the switching circuit/logic circuit 33 in accordance with the states of the local bit lines 31, 32.

Preferably, when implementing a read operation for the memory unit of the embodiments of FIGS. 11a and 11b, the local and global bit lines will be pre-charged to different voltages, as this guarantees that the local bit line(s) providing the capacitance are at a voltage that will cause an increased movement of the charge from the global bit line. By way of example, FIG. 12 is a timing diagram illustrating an embodiment of the read operation implemented for a memory unit as illustrated in FIGS. 11a and 11b.

Figure 12:
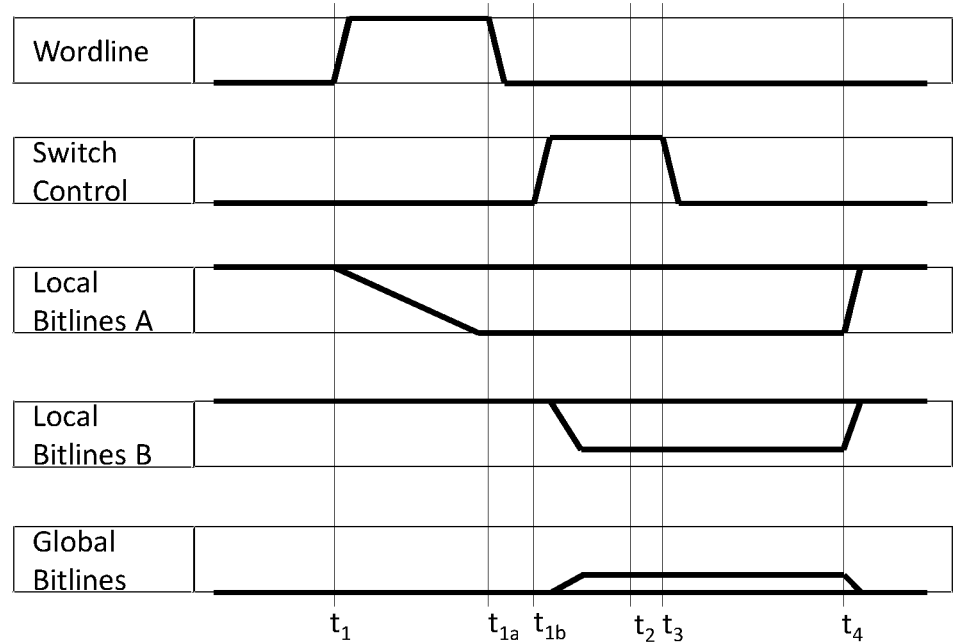
FIG. 12 is a timing diagram illustrating an embodiment for a read operation of a memory cell of an improved memory unit.

FIG. 12 illustrates a read operation of a memory cell in which the local bit lines are pre-charged high and global bit lines are pre-charged low. As in the read operation illustrated in FIG. 5, at time $t_1$ a word line is driven high. This word line allows the pair of local bit lines (A) of a memory cell group of which the memory cell is a part to connect the memory cell. The switch control signal remains deactivated, such that the global bit lines are isolated from the capacitance (e.g. provided by the local bit lines (B) of an adjacent memory cell group as illustrated in FIGS. 11a and 11b). At time $t_{1a}$ the word line is turned off, such that the memory cell is isolated from the local bit lines. At this point, a large voltage difference exists on the local bit lines (A) (i.e. between Local Bit A and Local nBit A) associated with the memory cell being read, whilst the local bit lines (B) associated with an adjacent memory cell group are still at their pre-charge level.

At time $t_{1b}$ the switch control signal is activated. As a result, the switching circuit/logic circuit 33 causes one of the global bit lines to be connected to the capacitance provided by the local bit lines (B) of an adjacent memory cell group. In particular, the switching circuit/logic circuit 33 uses a combination of the switch control signal and the observed state of the local bit lines (A) of the memory cell group of which the memory cell is a part to determine which of the global bit lines should be connected to the capacitance provided by the local bit lines (B) of an adjacent memory cell group.

Charge sharing therefore takes place between the global bit lines and a local bit line (B) of an adjacent memory cell group, resulting in a global bit line voltage difference that can be sensed by the sense amplifier at time $t_2$, whilst the voltages on the local bit lines (A) associated with the memory cell being read do not change. At time $t_3$ the switch control signal is deactivated, and at time $t_4$ the local and global bit lines are returned to their pre-charged state ready for the next access.

Figure 13:
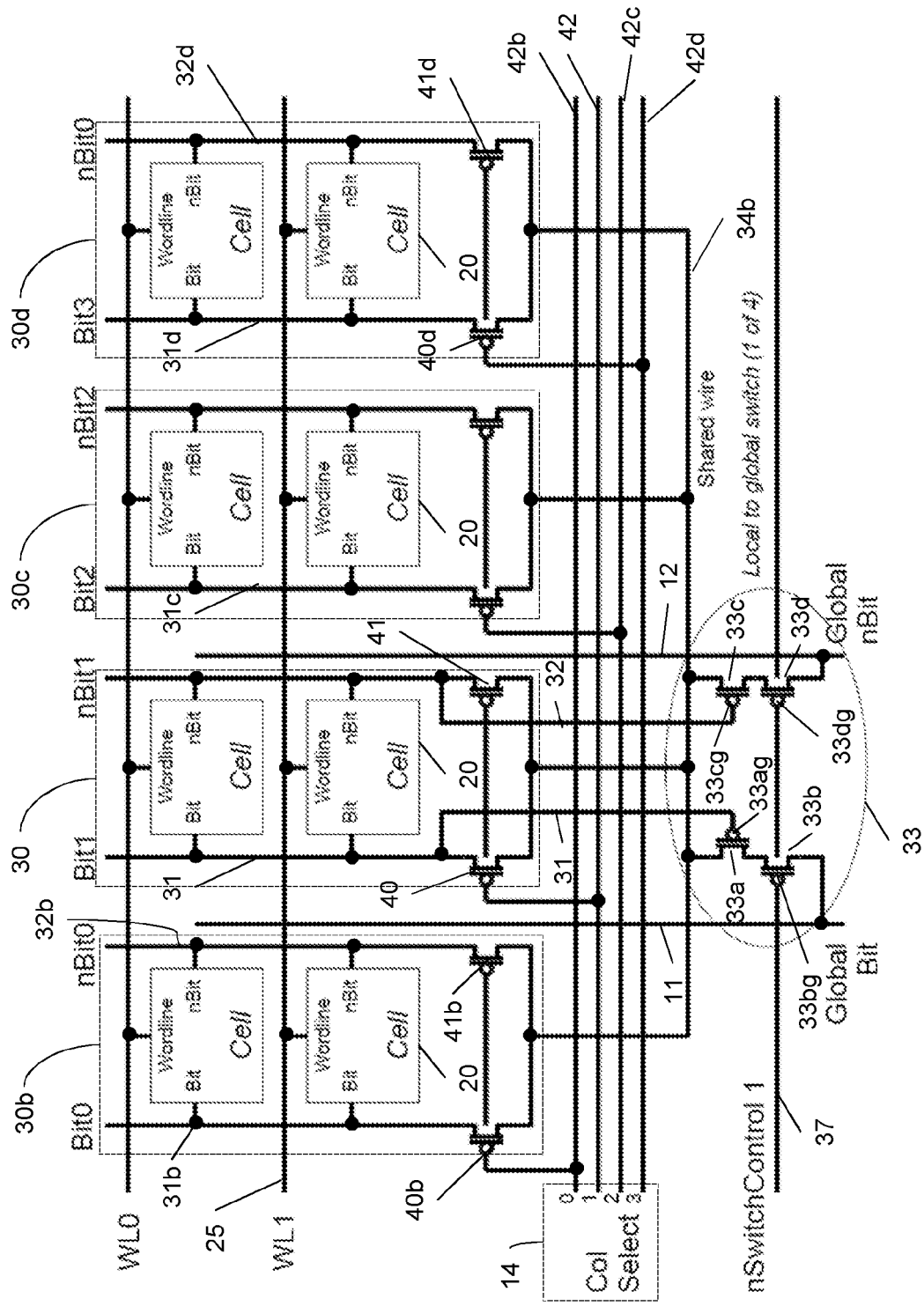
FIG. 13 illustrates an additional embodiment of an improved memory unit having a hierarchical bit line arrangement.

FIG. 13 illustrates a further embodiment of an improved memory unit 10 having a hierarchical bit line arrangement, in which the additional capacitance element is provided by the local bit lines of one or more further memory cell groups 30b, 30c, 30d for which at least one of the memory cells in each of the further memory cell groups 30b, 30c, 30d share a word line 25 with the memory cell to be read.

In FIG. 13, the memory unit 10 includes a plurality of memory cell groups 30, 30b, 30c, 30d, each including two separate memory cells 20 that are each associated with a word line 25. For each of these memory cell groups, the pair of local bit lines of the memory cell group are each operatively connected to a shared wire 34b via a respective switch 40, 41, wherein each pair of switches 40, 41 is activated by a corresponding column select signal 42, 42b, 42c, 42d provided by a column select circuit/local bit line selection circuit 14. The column select signals 42, 42b, 42c, 42d therefore provide that the local bit lines of each of these memory cell groups can be selectively connected to the shared wire 34b. In addition, for each of these memory cell groups, the local bit lines are connected to a switching circuit/logic circuit 33 that is configured to connect one or other of the global bit lines 11, 12 to the shared wire 34b in dependence upon the states of the local bit lines of the memory cell group. For simplicity, only a single switching circuit/logic circuit 33 of a single memory cell group 30 has been illustrated, although there could be more than one switching circuit/logic circuit within the memory unit and each switching circuit/logic circuit could be connected to more than one memory cell group.

Again, whilst the memory unit of FIG. 13 is illustrated as having memory cell groups that are comprised of two separate memory cells, this is a purely illustrative example, as the memory cell groups are not limited to two memory cells and may each comprise two or more memory cells.

In the memory unit illustrated in FIG. 13, the switching circuit/logic circuit 33 comprises two pairs of transistors 33a, 33b, 33c, 33d, one for each global bit line, wherein each pair of transistors operatively connects the respective global bit line 11, 12 to the shared wire 34b. Within each pair of transistors, a gate 33ag, 33cg of a first transistor 33a, 33c is connected to a local bit line 31, 32 of the memory cell group 30 and a gate 33bg, 33dg of a second transistor 33b, 33d is connected to the switch control line 37 (i.e. providing a switch control signal).

Figure 14:
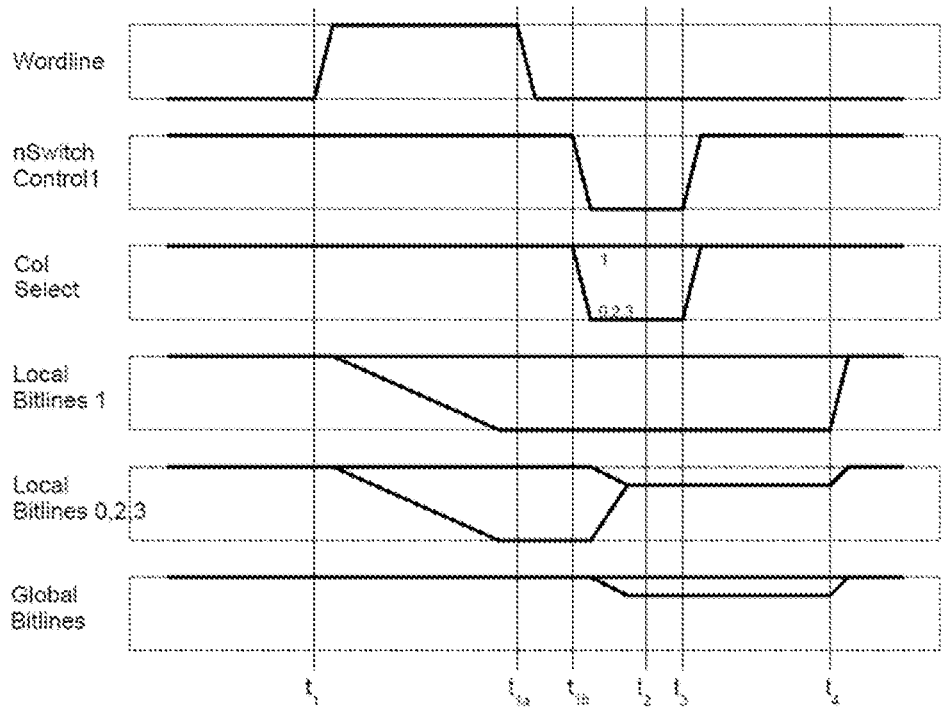
FIG. 14 is a timing diagram illustrating a read operation implemented for a memory unit as illustrated in FIG. 13.

FIG. 14 is a timing diagram illustrating a read operation implemented for a memory unit as illustrated in FIG. 13. As in previous embodiments, at time $t_1$ the word line associated with the memory cell to be read is driven high. This word line connects multiple memory cells in different memory cell groups (e.g. in the same row) to their respective local bit lines. The switch control signal 37 remains deactivated, so that the global bit lines are isolated from all of the local bit lines. In this embodiment, the switch control signal (nSwitchControl) is active when low. At this point, all column select signals are high. At time $t_{1a}$ the word line is turned off, so that the associated memory cells are isolated from the respective local bit lines. At this point, a large voltage difference exists on the local bit lines.

At time $t_{1b}$ the column select signals for those columns other than the column in which memory cell to be read is located are sent low, whilst the column select signal for the column in which memory cell to be read is located remains high. The pairs of local bit lines within those other columns are therefore connected to the shared wire. The switch control signal (nSwitchControl) is also activated (i.e. goes low), and in combination with the data on the local bit lines of the column to be read (column 1 in the example of FIG. 13), allows the shared wire to be connected to one or other global bit line (e.g. by turning on the appropriate transistors within the switching/logic circuit 33).

Charge sharing then takes place between the pairs of local bit lines that have been connected to the shared wire by the column select signals and one of the global bit lines, resulting in a global bit line voltage difference that can be sensed by the sense amplifier at time $t_2$. Therefore, as with the embodiments illustrated in FIGS. 10a, 10b, 11a, and 11b, in this embodiment the local bit lines in the column to be read do not actually connect to the global bit line (i.e. no charge flows between the local bit lines of the memory cell being read and the global bit lines). Instead, charge stored on the local bit lines of the memory cell being read controls the routing of the shared wire to the global bit lines. At time $t_3$ the switch control signal is deactivated, and at time $t_4$ the local and global bit lines are returned to their pre-charged state ready for the next operation.

In this read operation, one of the pair of local bit lines associated with one of the other columns (that does not include the memory cell to be read) will be discharged when the word line is raised high. Normally this discharging of other local bit lines that are not required to access the data in the memory cell to be read is merely an overhead, leading to increased operating power. However, in the read operation described with reference to FIG. 14, this discharging of the other local bit lines is made useful by providing the extra capacitance.

The above described memory units require that capacitances and pre-charge voltage levels be set so that the final voltage difference on the global bit line is sufficient to be reliably sensed as a 1 or a 0 (i.e. that the voltage difference is greater than the input offset voltage of the sense amplifier). The sense amplifier input offset voltage will vary between memories, and even between columns in the same memory, due to variability in the manufacturing process. There are two possible approaches to setting the capacitances and pre-charge voltages (and therefore the global bit line swing).

Firstly, a static selection can be made in which a voltage difference is chosen that will always be greater than the sense amplifier input offset for any likely manufacturing variability. The capacitances and pre-charge voltages can then be chosen in order to achieve this voltage difference. Whilst such a static selection will ensure that the memory unit always works, the memory unit may well have a higher power dissipation than is actually necessary. In particular, some sense amplifiers in some memories would actually work with a smaller bit line voltage difference (and a smaller power dissipation).

Secondly, a dynamic selection can be implemented that allows the capacitances or the pre-charge voltages to be varied, so that the memory unit is tuned to the properties of a particular sense amplifier. For instance, sense amplifiers with a lower input offset voltage could operate with a smaller bit line voltage difference, and consequently reduced power, while sense amplifiers with a larger input offset voltage could be operated with a larger bit line voltage difference. FIGS. 15a to 15c and 16a to 16c illustrate example embodiments for achieving such a dynamic selection.

FIG. 15a illustrates the memory unit of FIG. 13 and also includes a pre-charge voltage control circuit 15. The pre-charge voltage control circuit 15 includes a switch/transmission gate 15a controlled by complementary signals (Precharge and nPrecharge) that connects a pre-charge voltage supply 15b to the shared wire 34b. In this embodiment, the transmission gate allows a connection to be made between the shared wire and a signal that carries the pre-charge voltage. When the memory unit is operated in the way described with respect to FIG. 14 (i.e. with local and global bit lines pre-charged high), the voltage difference on the global bit lines will be greater when the shared wire is pre-charged low than when it is pre-charged high.

FIG. 15b illustrates the memory unit of FIG. 10b and further comprising a pre-charge voltage control circuit 15. In this embodiment the pre-charge voltage control circuit 15 provides two alternative pre-charge voltages (pre-charge voltage 1, pre-charge voltage 2) that can be connected to the capacitor that provides the capacitance element. A pre-charge select signal is then used to switch between the two alternative pre-charge voltages, by controlling whether the pre-charge voltage control circuit 15 provides pre-charge voltage 1 or pre-charge voltage 2.

FIG. 15c then illustrates the memory unit of FIG. 11b and further comprising a pre-charge voltage control circuit 15 provides two alternative pre-charge voltages (pre-charge voltage 1, pre-charge voltage 2) that can be connected to the local bit lines that provides the capacitance element (i.e. the local bit lines of an adjacent memory cell group that does not share a wordline with memory cell group).

FIG. 16a illustrates a memory unit that includes a capacitance control circuit 16. The capacitance control circuit 16 includes a switch 16a controlled by a capacitance control signal that connects an additional capacitance element 16b to the shared wire 34b. In this embodiment, the additional capacitance element 16b can be optionally connected to the shared wire, under the control of the capacitance control signal. When the memory unit is operated in the way described with respect to FIG. 14 (i.e. with local and global bit lines pre-charged high), the voltage difference on the global bit lines will be greater when the additional capacitance is connected to the shared wire and pre-charged low.

FIG. 16b illustrates the memory unit of FIG. 10b and further comprising a capacitance control circuit 16. In this embodiment the capacitance control circuit 16 includes a switch 16a controlled by a capacitance control signal that connects an additional capacitance element 16b to the switching/logic circuit 33. In this embodiment the additional capacitance element 16b is provided by an additional capacitor.

FIG. 16c then illustrates the memory unit of FIG. 11b and further comprising a capacitance control circuit 16. In this embodiment the capacitance control circuit 16 includes a switch 16a controlled by a capacitance control signal that connects an additional capacitance element 16b to the switching/logic circuit 33. In this embodiment the additional capacitance element 16b is provided by the other of a pair of complementary local bit lines of an adjacent memory cell group. Consequently, if additional capacitance is required, then both the local bit lines of an adjacent memory cell group are connected to one or other of the global bit lines 11, 12 in dependence upon the states of the local bit lines of the memory cell group being read Both the pre-charge voltage control signal and the capacitance control signal would preferably be connected to the groups of local bit lines that share the same sense amplifier. The pre-charge voltage control signal and/or the capacitance control signal can then be controlled by a feedback circuit. By way of example, a possible feedback control circuit 50 for these signals is shown in FIG. 17. In FIG. 17, groups of local bit lines 31, 32 are connected via a shared interface circuit 17 to shared global bit lines 11, 12 that go on to connect to a sense amplifier 51. For example, the shared interface circuit 17 could be provided by the column select circuit 14 and shared wire 34b of the embodiment illustrated in FIG. 13.

An error detecting circuit 52 monitors the output of multiple sense amplifiers in the memory. If it detects an error (e.g. through the use of a single error correcting/double error detecting (SEC/DED) encoding of data) then it passes the type and location of the error to a monitor circuit 53. If the monitor 53 identifies a particular sense amplifier 51 as having a high error rate, then it can change the control signal (i.e. the pre-charge voltage signal, or the capacitance control signal) for the associated interface circuits, so that the voltage swing on that sense amplifiers input is increased. This is achieved by setting the appropriate value in a latch 54. The latches 54 also have a shared initialisation input. This sets all columns to use the low swing/low power state initially. It is only after the detection of one or more errors that some of the interface circuits may be set to the higher voltage swing/higher power state.

The above described methods and apparatus provide reduced power in the presence of variability, while still maintaining operating speed. As described above, the charge used in a read operation is limited to the charge stored in the local bit lines. Therefore, a memory cell with a high read current cannot pull more charge from the local bit line than a memory cell with a low read current, since both are limited to the same voltage swing and the same capacitance. The various embodiments described above further limit the capacitance of the local bit lines, and thereby further reduce operating power.

It will be appreciated that individual items described above may be used on their own or in combination with other items shown in the drawings or described in the description and that items mentioned in the same passage as each other or the same drawing as each other need not be used in combination with each other. In addition, the expression "means" may be replaced by actuator or system or device as may be desirable. In addition, any reference to "comprising" or "consisting" is not intended to be limiting in any way whatsoever and the reader should interpret the description and claims accordingly.

Furthermore, although the invention has been described in terms of preferred embodiments as set forth above, it should be understood that these embodiments are illustrative only. Those skilled in the art will be able to make modifications and alternatives in view of the disclosure which are contemplated as falling within the scope of the appended claims. For example, those skilled in the art will appreciate that the above-described invention might be equally applicable to other types of memory. In particular, whilst the above described embodiments refer to memory units having pairs of local bit lines and corresponding pairs of global bit lines, the general principles of the methods and apparatus described above are equally applicable to memory units in which a memory cell group has a single local bit line such that the memory unit has a single corresponding global bit line. By way of example, the memory cells of flash memory devices typically have a single bit line. In flash memory devices digital data is stored by varying the threshold voltage of a transistor (e.g. the gate voltage at which the transistor starts to conduct). A word line is connected to the gate of the transistor, and during a read the word line is raised to a voltage that is sufficient to turn on the transistors that are storing a "0", but not those that are storing a "1". Thus, only those local bit lines that are connected to transistors that store a "0" are pulled down.

The invention claimed is:
1. A memory unit comprising:
   a) a plurality of memory cells, each memory cell being associated with a wordline, the plurality of memory cells being grouped into a plurality of memory cell groups;
   b) each memory cell group having one or more local bit lines operatively connected to each of the memory cells in the memory cell group for which access to the memory cell is controlled by the associated wordline; and c) one or more global bit lines connected to a sense amplifier, the sense amplifier being configured to determine a data value stored in the memory cell in dependence upon the states of the one or more global bit lines;

wherein each memory cell group is configured such that when the memory cell of the memory cell group is being read the one or more local bit lines of the memory cell group are provided as inputs to a logic circuit and are not connected to the global bit lines, the logic circuit being configured to cause a capacitance element to be connected to one of the one or more global bit lines in dependence upon the states of the one or more local bit lines of the memory cell group.

2. The memory unit of claim 1, wherein the capacitance element is provided by one or more local bit lines of one or more further memory cell groups, and the logic circuit is configured to connect one of the one or more global bit lines to one or more of the local bit lines of the one or more further memory cell groups.

3. The memory unit of claim 1, wherein the memory cell group of the memory cell being read is located within a column of the memory unit, and the capacitance element is provided by one or more of the local bit lines of an adjacent memory cell group that is located within the same column of the memory unit.

4. The memory unit of claim 1, wherein the memory cell being read is located within a row of the memory unit, and the capacitance element is provided by one or more further memory cell groups for which at least one of the memory cells in each of the one or more further memory cell groups is located within the same row of the memory unit.

5. The memory unit of claim 1, wherein the logic circuit is configured to connect one of the one or more global bit lines to the local bit lines of one or more further memory cell groups.

6. The memory unit of claim 1, and further comprising a local bit line selection circuit configured to control which of the local bit lines can be connected to the global bit line via the logic circuit.

7. The memory unit of claim 6, wherein the local bit lines of the memory cell group and one or more further memory cell groups are each operatively connected to a shared wire via a switch, the switches being controlled by the local bit line selection circuit, and the shared wire being operatively connected to the global bit lines via the logic circuit.

8. The memory unit of claim 7 wherein the switches connecting the local bit lines of each of the memory cell groups and the one or more further memory cell groups to the shared wire are configured to be activated by a corresponding column select signal provided by the local bit line selection circuit.

9. The memory unit of claim 7, wherein the local bit line selection circuit is configured such that, when the memory cell of the memory cell group is being read, the one or more local bit lines of the memory cell group are not connected to the shared wire or only the local bit lines of each of the one or more further memory cell groups are connected to the shared wire.

10. The memory unit of claim 1, and further comprising a pre-charge voltage control circuit comprising a switch controlled by a control signal that operatively connects a pre-charge voltage supply to a shared wire.

11. The memory unit of claim 1, and further comprising a capacitance control circuit comprising a switch controlled by a control signal that operatively connects an additional capacitance element to a shared wire.

12. The memory unit of claim 1, and further comprising a feedback control circuit configured to detect an error in a data value read from the memory cell by the sense amplifier and to vary a control signal for the memory cells associated with the sense amplifier in dependence upon a monitored error rate.

13. The memory unit of claim 12, wherein the feedback control circuit comprises an error detecting circuit, a monitor circuit and a latch, the error detecting circuit being configured to detect the error in a data value read from the memory cell by the sense amplifier and to report the error to the monitor circuit, the monitor circuit being configured to determine when the monitored error rate of the sense amplifier exceeds a threshold and to then cause a change in state of the latch, the output of the latch being provided as the control signal.

14. The memory unit of claim 1, wherein the memory unit has first and second global bit lines that are connected to the logic circuit, and each memory cell group has first and second local bit lines that are operatively connected to each of the memory cells in the memory cell group and that are connected as inputs to the logic circuit, the logic circuit being configured to cause the capacitance element to be connected to one or other of the first and second global bit lines in dependence upon the states of the first local bit line and the second local bit line of the memory cell group.

15. A method for reading the data value stored in the memory cell of the plurality of memory cells that are part of the memory unit as claimed in claim 1, the memory cells being grouped into the plurality of memory cell groups, wherein each memory cell group is associated with the one or more local bit lines, the method comprising:

i) pre-charging the one or more local bit lines associated with the memory cell to a first voltage level;

ii) connecting the one or more local bit lines to the memory cell such that the first voltage level of one of the one or more local bit lines is then dependent upon the data value stored in the memory cell;

iii) disconnecting the one or more local bit lines from the memory cell;

iv) causing the capacitance element to be connected to one of the one or more global bit lines in dependence upon the state of the one or more local bit lines; and v) without connecting the one or more local bit lines to either of the one or more global bit lines, sensing a voltage on the one or more global bit lines to determine the data value.

16. The method of claim 15, wherein the local bit lines are disconnected from the memory cell before or approximately concurrently with the connecting of the capacitance element to one of the one or more global bit lines.

17. The method of claim 15 further comprising:

detecting an error in the data value read from the memory cell by the sense amplifier;

determining an error rate for the sense amplifier; and when the determined error rate exceeds a threshold, varying one or more of the capacitances and the pre-charge voltages for the memory cells associated with the sense amplifier.

18. A memory unit comprising:

a) a plurality of memory cells, each memory cell being associated with a wordline, the plurality of memory cells being grouped into a plurality of memory cell groups;

b) each memory cell group having one or more local bit lines operatively connected to each of the memory cells in the memory cell group for which access to the memory cell is controlled by the associated wordline; and c) one or more global bit lines connected to a sense amplifier, the sense amplifier being configured to determine a data value stored in the memory cell in dependence upon the states of the one or more global bit lines;

wherein the one or more local bit lines of the memory cell group are connected to a logic circuit, and the logic circuit is configured to cause a capacitor to be connected to one of the one or more global bit lines in dependence upon the states of the one or more local bit lines of the memory cell group.

19. A memory unit comprising:

a) a plurality of memory cells, each memory cell being associated with a wordline, the plurality of memory cells being grouped into a plurality of memory cell groups;

b) each memory cell group having one or more local bit lines operatively connected to each of the memory cells in the memory cell group for which access to the memory cell is controlled by the associated wordline; and c) one or more global bit lines connected to a sense amplifier, the sense amplifier being configured to determine a data value stored in the memory cell in dependence upon the states of the one or more global bit lines;

wherein the one or more local bit lines of the memory cell group are connected to a logic circuit, and the logic circuit is configured to cause one or more of the local bit lines of an adjacent memory cell group that does not share the wordline with the memory cell group to be connected to one of the one or more global bit lines in dependence upon the states of the one or more local bit lines of the memory cell group.

* * * * *